United States Patent
Tanabe et al.

(10) Patent No.: US 6,503,819 B2
(45) Date of Patent: *Jan. 7, 2003

(54) FABRICATION PROCESS OF A SEMICONDUCTOR INTEGRATED CIRCUIT DEVICE

(75) Inventors: Yoshikazu Tanabe, Iruma (JP); Isamu Asano, Iruma (JP); Makoto Yoshida, Ome (JP); Naoki Yamamoto, Kawaguchi (JP); Masayoshi Saito, Hachiouji (JP); Nobuyoshi Natsuaki, Higashiyamato (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/773,000

(22) Filed: Jan. 31, 2001

(65) Prior Publication Data

US 2001/0024870 A1 Sep. 27, 2001

Related U.S. Application Data

(63) Continuation of application No. 09/086,568, filed on May 29, 1998, now Pat. No. 6,197,702.

(30) Foreign Application Priority Data

May 30, 1997 (JP) ............................................. 9-142315

(51) Int. Cl.$^7$ ................. H01L 21/3205; H01L 21/4763
(52) U.S. Cl. ....................................... 438/591; 438/773
(58) Field of Search ................................. 438/287, 296, 438/216, 585, 591, 773

(56) References Cited

U.S. PATENT DOCUMENTS

| | | |
|---|---|---|
| 4,282,270 A | 8/1981 | Nozaki et al. |
| 5,341,016 A | 8/1994 | Prall et al. |
| 5,387,540 A | 2/1995 | Poon et al. |
| 6,162,741 A | 12/2000 | Akasaka et al. |
| 6,197,702 B1 * | 3/2001 | Tanabe et al. .............. 438/773 |
| 6,362,086 B2 | 3/2002 | Weimer et al. |

FOREIGN PATENT DOCUMENTS

| | | |
|---|---|---|
| JP | 56-107552 | 8/1981 |
| JP | 58-4924 | 1/1983 |

(List continued on next page.)

OTHER PUBLICATIONS

Kou Nakamura, et al., "Hydrogen–Radical–Balanced Steam Oxidation Technology for Ultra–Thin Oxide with High Reliability", The Electrochemical Society of Japan, Electronic Materials Committee, Proceedings of the 45$^{th}$ Symposium on Semiconductors and Integrated Circuits Technology, Tokyo, Dec. 1 and 2, 1993, pp. 128–133.

(List continued on next page.)

*Primary Examiner*—Olik Chaudhuri
*Assistant Examiner*—Ginette Peralta
(74) *Attorney, Agent, or Firm*—Antonelli, Terry, Stout & Kraus, LLP

(57) ABSTRACT

With a view to preventing the oxidation of a metal film at the time of light oxidation treatment after gate patterning and at the same time to making it possible to control the reproducibility of oxide film formation and homogeneity of oxide film thickness at gate side-wall end portions, in a gate processing step using a poly-metal, a gate electrode is formed by patterning a gate electrode material which has been deposited over a semiconductor wafer 1A having a gate oxide film formed thereon and has a poly-metal structure and then, the principal surface of the semiconductor wafer 1A heated to a predetermined temperature or vicinity thereof is supplied with a hydrogen gas which contains water at a low concentration, the water having been formed from hydrogen and oxygen by a catalytic action, to selectively oxidize the principal surface of the semiconductor wafer 1A, whereby the profile of the side-wall end portions of the gate electrode is improved.

34 Claims, 21 Drawing Sheets

FOREIGN PATENT DOCUMENTS

| | | |
|---|---|---|
| JP | 59-10271 | 1/1984 |
| JP | 59132136 | 7/1984 |
| JP | 60-734 | 1/1985 |
| JP | 60-72229 | 4/1985 |
| JP | 60-123060 | 7/1985 |
| JP | 60-147136 | 8/1985 |
| JP | 61-127123 | 6/1986 |
| JP | 61-127124 | 6/1986 |
| JP | 61-152076 | 7/1986 |
| JP | 61-267365 | 11/1986 |
| JP | 1-94657 | 4/1989 |
| JP | 3119763 | 5/1991 |
| JP | 5152282 | 6/1993 |
| JP | 6-115903 | 4/1994 |
| JP | 6-163517 | 6/1994 |
| JP | 6-333918 | 12/1994 |
| JP | 794716 | 4/1995 |
| JP | 407235542 | 9/1995 |
| JP | 408264531 | 10/1996 |
| JP | 9-172011 | 6/1997 |
| WO | WO97/28085 | 8/1997 |

OTHER PUBLICATIONS

"Hydrogen–Radical–Balanced Steam Oxidation Technology For Ultra–Thin Oxide With High Reliability", by K. Nakamura, et al. pp. 128–133.

Tanaba, et al., "Diluted Wet Oxidation" A Novel Technique for Ultra Thin Gate Oxide Formation (Oct. 1997).

* cited by examiner

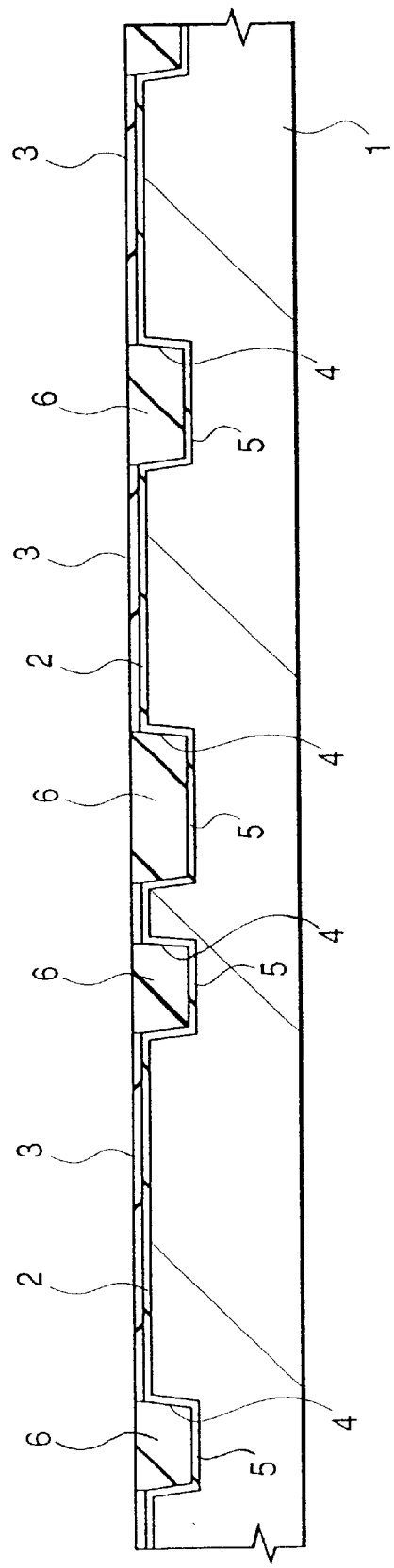
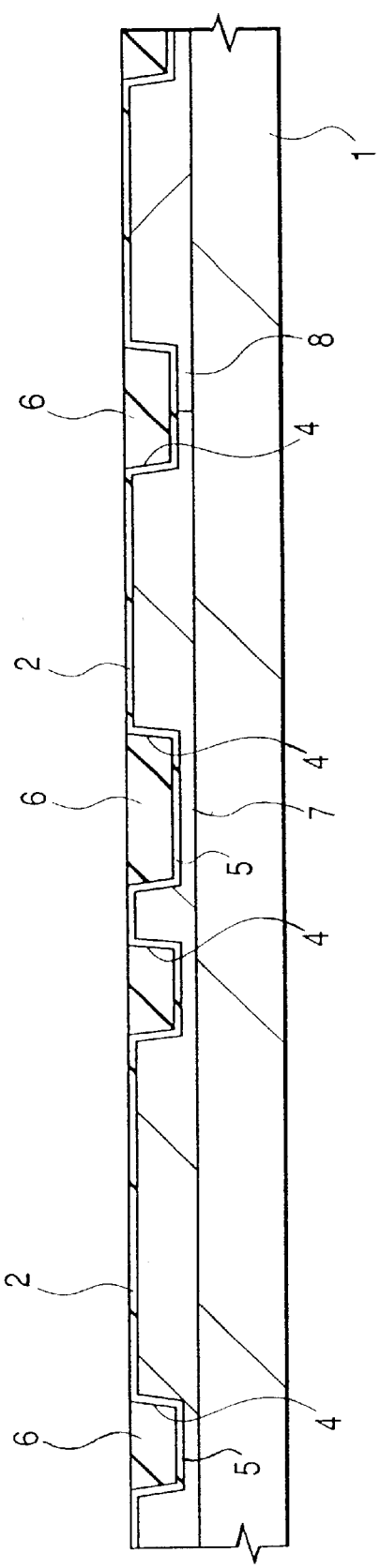
FIG. 4
FIG. 5

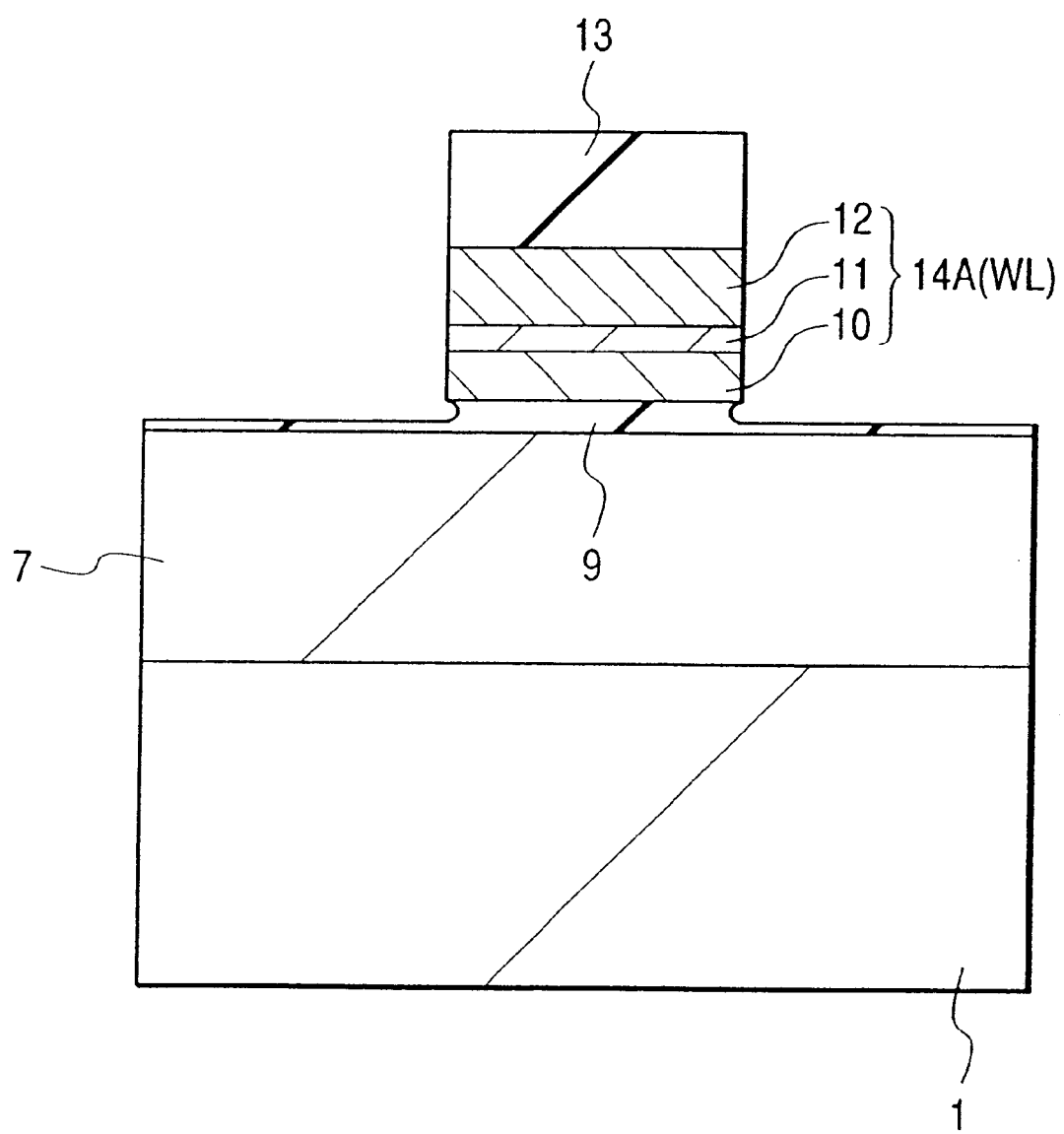

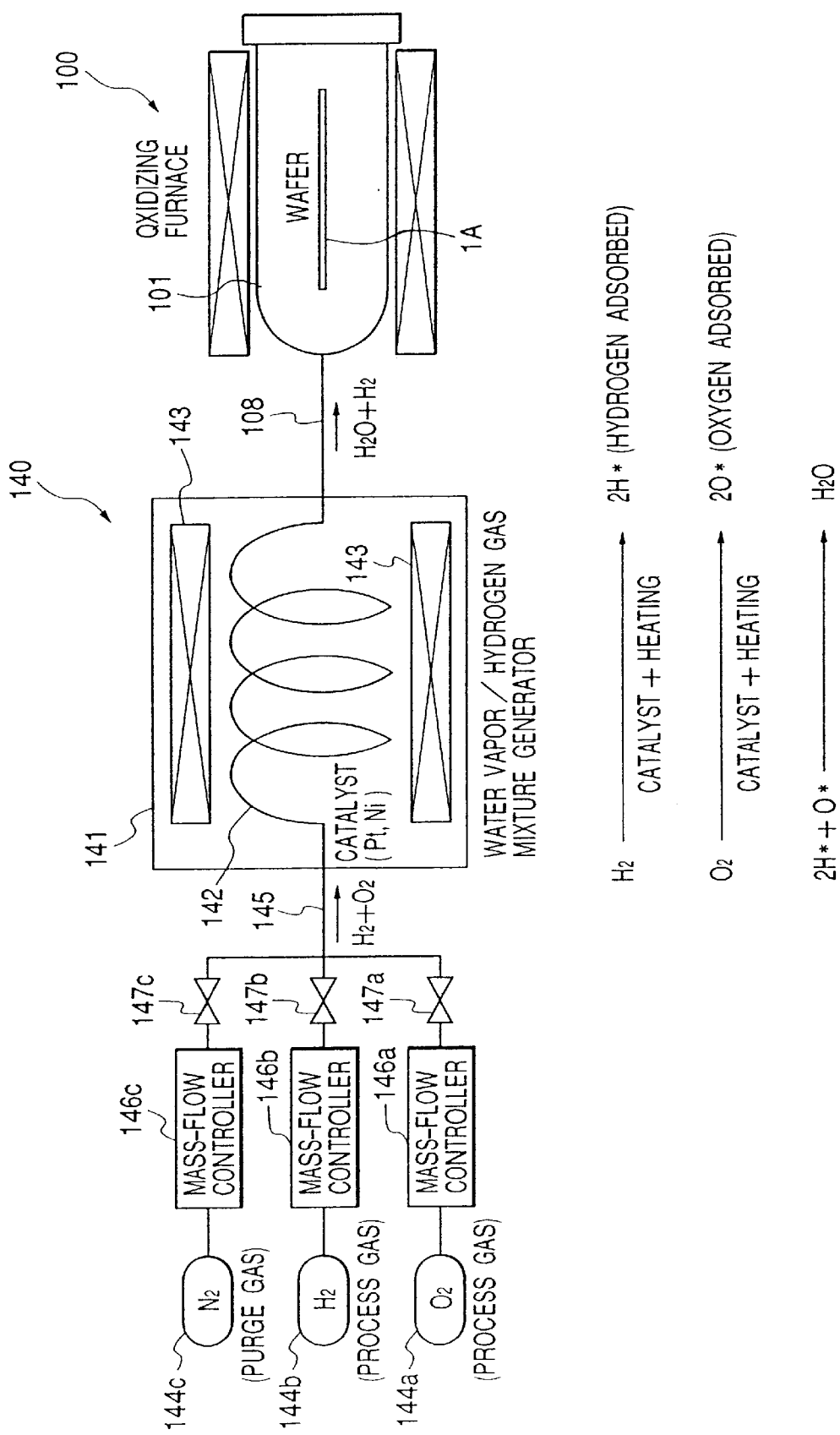

(a) $W + 3H_2O \rightleftharpoons WO_3 + 3H_2$
(b) $Mo + 2H_2O \rightleftharpoons MoO_2 + 2H_2$
(c) $2Ta + 5H_2O \rightleftharpoons Ta_2O_5 + 5H_2$
(d) $Si + 2H_2O \rightleftharpoons SiO_2 + 2H_2$
(e) $Ti + 2H_2O \rightleftharpoons TiO_2 + 2H_2$

FABRICATION PROCESS OF A SEMICONDUCTOR INTEGRATED CIRCUIT DEVICE

This application is a Continuation application of application Ser. No. 09/086,568, filed May. 29, 1998 now U.S. Pat. No. 6,197,702.

BACKGROUND OF THE INVENTION

This invention relates to a process for the fabrication of a semiconductor integrated circuit device, particularly to a technique effective when applied to gate processing of a MOSFET (Metal Oxide Semiconductor Field Effect Transistor) having a poly-metal gate.

Japanese Patent Application Laid-Open No. H5-152282 (which will hereinafter be called "Ohmi"), dicloses an oxide film forming device for oxidizing a semiconductor wafer, or the like, with water synthesized using a catalyst, such as nickel.

On pages 128–133 of Papers of the Lecture addressed at the 45-th Symposium of Semiconductor Integrated Circuit Technique held on Dec. 1–2, 1992 (which will hereinafter be called "Nakamura"), oxide film formation under a strong reducing atmosphere, which contains water vapor synthesized by a stainless catalyst is disclosed.

Japanese Patent Application Laid-Open No. S59-132136 (which will hereinafter be called "Kobayashi"), discloses a process, in a silicon semiconductor integrated circuit device having a refractory metal (high-melting point metal) gate, for carrying out auxiliary thermal oxidation (which will hereinafter be called "light oxidation" or "auxiliary oxidation after gate formation") not of the gate metal itself, but necessary portions other than the gate metal, under a mixed atmosphere of water vapor and hydrogen after gate patterning, thereby adjusting an insulation film at the periphery below the gate.

Similarly, Japanese Patent Application Laid-Open No. H3-119763 (which will hereinafter be called "Katada") and Japanese Patent Application Laid-Open No. H7-94716 (which will hereinafter be called "Muraoka"), discloses a process for forming a gate having a three-layered structure made of tungsten, titanium nitride and polysilicon, and then subjecting it to oxidation treatment under a mixed atmosphere of hydrogen, water vapor and nitrogen.

It is presumed that for a device having a circuit formed of a minute MOSFET, whose gate length is 0.25 $\mu$m or smaller, such as a DRAM (Dynamic Random Access Memory) of the type available since the development of the 256 Mbit (megabit) memory, a gate processing step using a low-resistance conductive material including a metal film will become indispensable to reduce the parasitic resistance of a gate electrode.

As such a low-resistance gate electrode material, so-called poly-metal (which generally means a refractory metal formed directly or indirectly over a polycrystalline silicon electrode) having a refractory metal film stacked over a polycrystalline silicon film is regarded as promising. The poly-metal can be used not only as a gate electrode material, but also as an interconnection material because it has a sheet resistance as low as 2 $\Omega/\square$. According to an investigation by the present inventors, W (tungsten) Mo (molybdenum), Ti (titanium) or the like, which exhibits a good low resistance even in a low temperature process not higher than 800° C. and has a high electro-migration resistance, can be used as the refractory metal. Since the stacking of such a refractory metal film directly on a polycrystalline silicon film lowers the adhesion between these two films or tends to form a high-resistance silicide layer at the interface between these two films by a high-temperature heat treatment process, the poly-metal gate is practically formed of a three-layered structure having, between the polycrystalline silicon film and the refractory metal film, a barrier layer made of a metal nitride film, such as TiN (titanium nitride) or WN (tungsten nitride).

Based on an investigation by the present inventors, gate processing is conventionally carried out as follows. First, a semiconductor substrate is thermally oxidized to form a gate oxide film on its surface. Although a thermally oxidized film is generally formed in a dry oxygen atmosphere, wet oxidation is employed for the formation of a gate oxide film because the defect density in the film can be reduced. In wet oxidation, a pyrogenic method is employed in which water is formed by the combustion of hydrogen in an oxygen atmosphere and then fed to the surface of a semiconductor wafer together with oxygen.

The pyrogenic method, however, is accompanied with the drawback that combustion is effected by igniting hydrogen jetted from a nozzle attached to the tip of a quartz-made hydrogen gas inlet tube, but heat generated upon combustion melts the nozzle and generates particles, which presumably become a contamination source for the semiconductor wafer. For the formation of water, therefore, a method using a catalyst without combustion also has been proposed.

The above-described Ohmi publication discloses a thermal oxidation apparatus having a hydrogen gas inlet tube formed at its inside from Ni (nickel) or a Ni-containing material and is equipped with means for heating the hydrogen gas inlet tube. In this thermal oxidation apparatus, Ni (or a Ni-containing material) inside of the hydrogen gas inlet tube heated at 300° C. or higher is brought into contact with hydrogen to generate a hydrogen activated species and then, the hydrogen activated species is reacted with oxygen (or an oxygen-containing gas), whereby water is generated. Water is thus generated in such a catalytic manner without combustion so that neither melting of the quartz-made hydrogen gas inlet tube at its tip point nor generation of particles occurs.

Over the gate oxide film formed by such a wet oxidation method, a gate electrode material is deposited, followed by patterning of the gate electrode material by dry etching with a photoresist as a mask. After the photoresist is removed by ashing treatment, the dry etching residue or ashing residue on the surface of the substrate is removed using an etching solution, such as hydrofluoric acid.

By the above-described wet etching, the gate oxide film in a region other than that below the gate electrode is etched and, at the same time, the gate oxide film at the side wall end portions of the gate electrode are etched isotropically and undercuts are formed, which brings about inconveniences, such as lowering in pressure resistance of the gate electrode. With a view to improving the profile having undercuts formed at the side-wall end portions of the gate electrode, the substrate is subjected to light oxidation treatment, that is, it is subjected to thermal oxidation again to form an oxide film on its surface.

The above-described refractory metals, such as W and Mo, are considerably prone to oxidation under a high-temperature oxygen atmosphere so that the application of the above light oxidation treatment to a gate electrode of a poly-metal structure oxidizes the refractory metal film, thereby increasing its resistance or partially peeling off the film from the substrate. In the gate processing using a poly-metal, it is therefore necessary to take countermeasures against the oxidation of a refractory metal film upon light oxidation treatment.

The above-described Kobayashi publication discloses a technique of selectively oxidizing Si without oxidizing a W (Mo) film by forming over a Si (silicon) substrate a gate electrode of a W- or Mo-film-containing poly-metal structure and then carrying out light oxidation in a mixed atmosphere of water vapor and hydrogen. This technique makes use of the difference between W (or Mo) and Si in a water vapor/hydrogen partial pressure ratio which brings about equilibrium in redox reaction. In this technique, selective oxidation of Si is realized by setting the partial pressure ratio within a range where W (or Mo) once oxidized by water vapor is reduced rapidly by coexisting hydrogen, but Si remains oxidized. The mixed atmosphere of water vapor and hydrogen is generated by the bubbling system which feeds hydrogen gas in pure water carried in a container and the water vapor/hydrogen partial pressure ratio is controlled by changing the temperature of the pure water.

The above-described Katada and Muraoka publication disclose a technique of forming a gate electrode of a poly-metal structure, more specifically, forming a metal nitride film such as TiN and a metal film such as W on a Si substrate through a gate oxide film, and then carrying out light oxidation in an atmosphere obtained by diluting a reducing gas (hydrogen) and an oxidizing gas (water vapor) with nitrogen. According to this, only Si can be oxidized selectively without oxidation of the metal film. At the same time, oxidation of the metal nitride film can be prevented, because denitrifying reaction from the nitride metal film can be prevented by diluting the water vapor/hydrogen mixed gas with nitrogen.

As described above, in the step of forming a gate electrode of a poly-metal structure, it is effective for an improvement in the pressure resistance of a gate oxide film and oxidation prevention of a metal film, to carry out light oxidation in a water vapor/hydrogen mixed gas having a predetermined partial pressure.

The conventional bubbling method, which has been proposed as a method for forming the water vapor/hydrogen mixed gas, is accompanied with the drawback that since the water vapor/hydrogen mixed gas is generated by supplying a hydrogen gas into pure water charged in advance in a container, foreign matters mixed in pure water is fed to an oxidizing furnace together with the water vapor/hydrogen mixed gas and presumably contaminates the semiconductor wafer.

The bubbling method is also accompanied with other drawbacks in that, since the water vapor/hydrogen partial pressure is controlled by changing the temperature of pure water, (1) the partial pressure ratio varies easily and the optimum pressure ratio cannot be attained with high precision, and (2) a water vapor concentration on the order of ppm cannot be attained owing to the controllable range of the water vapor concentration, which is as narrow as several to ten-odd %.

As will be described later, in the redox reaction of Si or a metal by using a water vapor/hydrogen mixed gas, oxidation tends to proceed faster when the water vapor concentration is higher. When Si is oxidized at a comparatively high water vapor concentration as the water vapor/hydrogen mixed gas formed by the bubbling system, the oxide film grows in a markedly short time owing to a high oxidation rate. A minute MOSFET having a gate length not greater than 0.25 µm is required to have a gate oxide film as thin as 5 nm or less in order to maintain the electrical properties of the device. Accordingly, it is difficult to form such a ultra-thin gate oxide film uniformly and with good controllability if the water vapor/hydrogen mixed gas generated by the bubbling method is used. When oxidation is carried out at a low temperature (for example, 80° C. or lower) to reduce the growth rate of the oxide film, a gate oxide film having good quality cannot be obtained.

SUMMARY OF THE INVENTION

An object of the present invention is to provide a technique which prevents, in gate processing by using a poly-metal, the oxidation of a metal film upon light oxidation treatment after patterning of a gate electrode and makes it possible to control reproducibility of the oxide film formation and homogeneity of the oxide film thickness at side wall end portions of the gate electrode.

The above and other objects and novel features of the present invention will become apparent from the following description thereof and the accompanying drawings.

Among the features disclosed in the present application, typical ones will be summarized briefly as follows:

(1) A process for the fabrication of a semiconductor integrated circuit device according to the present invention comprises depositing a conductive film including at least a metal film over a gate oxide film formed on the principal surface of a semiconductor substrate and patterning the conductive film to form a gate electrode for a MOSFET; and feeding a hydrogen gas containing water vapor generated from hydrogen and oxygen by catalytic action to the principal surface of the semiconductor substrate heated to a predetermined temperature or vicinity thereof to selectively oxidize the principal surface of the semiconductor substrate, thereby improving a profile of side-wall end portions of the gate electrode.

(2) In the above process, the conductive film includes at least a W film or a Ti film.

(3) In the above process, the water vapor/hydrogen partial pressure ratio of the water-vapor-containing hydrogen gas is set within a range reducing the metal film and oxidizing the principal surface of the semiconductor substrate.

(4) In the above process, the conductive film contains at least a Ti film and the principal surface of the semiconductor substrate is selectively oxidized using hydrogen gas which contains water vapor at a concentration low enough to suppress deterioration of the gate electrode due to oxidation of the Ti film to the minimum.

(5) In the above process, the conductive film includes at least a W film and the principal surface of the semiconductor substrate is selectively oxidized using hydrogen gas which contains water vapor at a concentration low enough to permit the control of oxidation rate and oxide film thickness.

(6) A process for the fabrication of a semiconductor integrated circuit device according to the present invention comprises depositing a conductive film including at least a metal film over a gate oxide film, which has been formed on the principal surface of a semiconductor substrate to have a film thickness not greater than 5 nm, and patterning the conductive film to form a gate electrode for a MOSFET; and feeding hydrogen gas containing water vapor, which has been formed from hydrogen and oxygen by catalytic action, at a concentration low enough to permit the control of reproducibility of oxide film formation and homogeneity of an oxide film thickness to the principal surface of the semiconductor substrate heated to a predetermined temperature or vicinity thereof to selectively oxidize the principal surface of the semiconductor substrate, thereby improving a profile of side-wall end portions of the gate electrode.

(7) A process for the fabrication of a semiconductor integrated circuit device according to the present invention comprises the following steps (a) to (d):
   (a) thermally oxidizing a semiconductor substrate to form over the principal surface thereof a gate oxide film and then depositing a conductive film containing at least a metal film over the gate oxide film;
   (b) patterning the conductive film by dry etching with a photoresist film as a mask to form a gate electrode for a MOSFET;
   (c) wet etching the principal surface of the semiconductor substrate after removal of the photoresist film; and
   (d) setting a water vapor/hydrogen partial pressure ratio of a hydrogen gas containing water vapor generated from hydrogen and oxygen by catalytic action within a range which reduces the metal film and oxidizes the principal surface of the semiconductor substrate, and selectively oxidizing the principal surface of the semiconductor substrate by feeding the water-vapor-containing hydrogen gas to the principal surface of the semiconductor substrate heated to a predetermined temperature or the vicinity thereof, thereby improving a profile of side-wall end portions of the gate electrode impaired by the wet etching.

(8) In the above process, the conductive film is made of a polycrystalline silicon film, a metal nitride film deposited over the polycrystalline silicon film and a metal film deposited over the metal nitride film.

(9) In the above process, the metal nitride film is made of WN or TiN, while the metal film is made of W, Mo or Ti.

(10) In the above process, the gate electrode has a gate length not greater than 0.25 $\mu$m.

(11) In the above process, the gate electrode is a gate electrode of a MISFET for memory cell selection which constitutes a memory cell of a DRAM.

(12) In the above process, the semiconductor substrate is heated at 800 to 900° C.

(13) In the above process, the principal surface of the semiconductor substrate is selectively oxidized by a single-wafer-process system.

(14) In the above process, the principal surface of the semiconductor substrate is selectively oxidized by batch treatment.

Other aspects of the present invention will next be described by the item:

1. A process for the fabrication of a semiconductor integrated circuit device comprising the following steps:
   (a) forming a polysilicon film over a silicon-oxide-film-containing gate insulation film formed over the silicon surface of a semiconductor wafer;
   (b) forming a refractory metal film made mainly of tungsten over the polysilicon film directly or through a barrier layer;
   (c) forming a gate electrode by patterning the polysilicon film and the refractory metal film; and
   (d) subsequent to the step (c), subjecting the silicon and polysilicon portions to additional thermal oxidation treatment under a mixed atmosphere containing a hydrogen gas and water vapor synthesized from oxygen and hydrogen gases by a catalyst.

2. A process as described under item 1 above, wherein the barrier layer contains a tungsten nitride film.

3. A process as described under item 2 above, wherein the step (d) is carried out under conditions which do not substantially oxidize the refractory metal film and the barrier layer.

4. A process as described under item 3 above, wherein the gate insulation film contains a silicon oxide nitride film.

5. A process for the preparation of a semiconductor integrated circuit device, which comprises the following steps:
   (a) forming a polysilicon film over a silicon-oxide-film-containing gate insulation film formed over the silicon surface of a semiconductor wafer;
   (b) forming a refractory metal film over the polysilicon film directly or through a barrier layer;
   (c) forming a gate electrode by patterning the polysilicon film and the refractory metal film; and
   (d) subsequent to the step (c), subjecting the silicon and polysilicon portions to additional thermal oxidation treatment under a mixed atmosphere containing a hydrogen gas and water vapor synthesized from oxygen and hydrogen gases by a catalyst.

6. A process as described under item 5 above, wherein a barrier layer is provided.

7. A process as described under item 6 above, wherein the step (d) is carried out under conditions which do not substantially oxidize the refractory metal film and the barrier layer.

8. A process for the fabrication of a semiconductor integrated circuit device, which comprises the following step:
   (a) carrying out heat treatment to oxidize, between a first region and a second region being made of a material different from that of the first region, each over a semiconductor wafer, the first region under a mixed atmosphere containing a hydrogen gas and water vapor synthesized from oxygen and hydrogen gases by a catalyst without substantially oxidizing the second region.

9. A process as described under item 8 above, wherein the first region is a part of the wafer itself.

10. A process as described under item 9 above, wherein the second region is a thin film formed directly or indirectly over the surface of the wafer.

11. A process for the fabrication of a semiconductor integrated circuit device, which comprises following steps:
   (a) forming a first film made mainly of silicon over a silicon-oxide-film-containing gate insulation film formed over the silicon surface of a semiconductor wafer;
   (b) forming a refractory metal film over the polysilicon film directly or through a barrier layer;
   (c) forming a gate electrode by patterning the first film and the refractory metal film; and
   (d) subsequent to the step (c), subjecting the silicon and polysilicon portions to additional thermal oxidation treatment under a mixed atmosphere containing a hydrogen gas and water vapor synthesized from oxygen and hydrogen gases by a catalyst.

12. A process as described under item 11 above, wherein the step (d) is carried out under conditions for not substantially oxidizing the refractory metal film.

13. A process for the fabrication of a semiconductor integrated circuit device, which comprises the following steps:
   (a) forming, on the silicon surface of a semiconductor wafer, a groove for element isolation;
   (b) embedding the groove for element isolation with an embedding material from outside;
   (c) flattening the surface of the wafer by chemical mechanical polishing subsequent to the step (b);
   (d) forming a polysilicon film over a silicon-oxide-film-containing gate insulation film formed over the silicon surface of the semiconductor wafer;
   (e) forming a refractory metal film over the polysilicon film directly or through a barrier layer;
   (f) forming a gate electrode by patterning the polysilicon film and the refractory metal film; and
   (g) subsequent to the step (f), subjecting the silicon and polysilicon portions to thermal oxidation treatment without substantially oxidizing the refractory metal film under a mixed atmosphere containing a hydrogen gas and water vapor.

14. A process as described under item 13 above, wherein the barrier layer contains a nitride film of the refractory metal.

15. A process as described under item 14 above, wherein the refractory metal is tungsten.

16. A process for the fabrication of a CMOS semiconductor integrated circuit device, which comprises the following steps:
   (a) forming a polysilicon film over a silicon-oxide-film-containing gate insulation film formed over the silicon surface of a semiconductor wafer;
   (b) forming a refractory metal film made mainly of tungsten over the polysilicon film directly or through a barrier layer containing a tungsten nitride film;
   (c) forming a gate electrode by patterning the polysilicon film and the refractory metal film; and
   (d) subsequent to the step (c), subjecting the silicon and polysilicon portions to thermal oxidation treatment without substantially oxidizing the refractory metal film under a mixed atmosphere containing a hydrogen gas and water vapor.

17. A process for the fabrication of a CMOS semiconductor integrated circuit device, which comprises the following steps:
   (a) forming a polysilicon film over a silicon-oxide-film-containing gate insulation film formed over the silicon surface of a semiconductor wafer;
   (b) forming a refractory metal film made mainly of tungsten over the polysilicon film through a barrier layer containing a tungsten nitride film;
   (c) forming a gate electrode by patterning the polysilicon film and the refractory metal film; and
   (d) subsequent to the step (c), subjecting the silicon and polysilicon portions to thermal oxidation treatment without substantially oxidizing the refractory metal film under a mixed atmosphere of gases oxidative and reductive to silicon and polysilicon.

18. A process for the fabrication of a semiconductor integrated circuit device, which comprises the following steps:
   (a) forming a polysilicon film over a silicon-oxide-film-containing gate insulation film formed over the silicon surface of a semiconductor wafer;
   (b) forming a refractory metal film made mainly of tungsten over the polysilicon film directly or through a barrier layer;
   (c) forming a gate electrode by patterning the polysilicon film and the refractory metal film; and
   (d) subsequent to the step (c), subjecting the silicon and polysilicon portions to additional thermal oxidation treatment without substantially oxidizing the refractory metal film under a mixed atmosphere of a gas reductive to silicon and polysilicon and an oxidizing gas synthesized by a catalyst oxidative to silicon and polysilicon.

19. A process as described under item 18 above, wherein the barrier layer contains a tungsten nitride film.

20. A process as described under item 19 above, wherein the gate insulation film contains a silicon oxide nitride film.

Other features of the present invention will next be described by item as follows.

21. A process for the fabrication of a semiconductor integrated circuit, which comprises depositing a conductive film containing at least a metal film over a gate oxide film formed on the principal surface of a semiconductor substrate and then forming a gate electrode for MOSFET by patterning the conductive film; and supplying a hydrogen gas containing water vapor formed from hydrogen and oxygen by catalytic action to the principal surface of the semiconductor substrate heated at a predetermined temperature or the vicinity thereof and selectively oxidizing the principal surface of the semiconductor substrate, thereby improving a profile of side-wall end portions of the gate electrode.

22. A process as described under item 21 above, wherein the conductive film contains at least a W film or Ti film.

23. A process as described under item 21 above, wherein a water vapor/hydrogen partial pressure ratio of the water-vapor-containing hydrogen gas is set within a range which reduces the metal film and oxidizes the principal surface of the semiconductor substrate.

24. A process as described under item 21 above, wherein the conductive film contains at least a Ti film and the principal surface of the semiconductor substrate is selectively oxidized using a hydrogen gas which contains water vapor at a concentration low enough to suppress deterioration of the gate electrode owing to the oxidation of the Ti film to the minimum.

25. A process as described under item 21 above, wherein the conductive film contains at least a W film and the principal surface of the semiconductor substrate is selectively oxidized using a hydrogen gas which contains water vapor at a concentration low enough to permit control of the oxidizing rate and oxide film thickness.

26. A process for the fabrication of a semiconductor circuit device, which comprises depositing a conductive film containing at least a metal film over a gate oxide film which has been formed on the principal surface of a semiconductor substrate to have a film thickness not greater than 5 nm and then forming a gate electrode for a MOSFET by patterning the conductive film; and supplying a hydrogen gas which contains water vapor, formed from hydrogen and oxygen by catalytic action, at a concentration low enough to permit the control of reproducibility of oxide film formation and homogeneity of oxide film thickness to the principal surface of the substrate heated at a predetermined temperature or the vicinity thereof and selectively oxidizing the principal surface of the semiconductor substrate, thereby improving a profile of side-wall end portions of the gate electrode.

27. A process for the fabrication of a semiconductor integrated circuit, which comprises the following steps (a) to (d):

(a) thermally oxidizing a semiconductor substrate to form a gate oxide film on the principal surface of the substrate and then depositing a conductive film containing at least a metal film over the gate oxide film;

(b) patterning the conductive film by dry etching using a photoresist film as a mask, thereby forming a gate electrode for a MOSFET;

(c) removing the photoresist film and then wet etching the principal surface of the semiconductor substrate; and (d) setting a water vapor/hydrogen partial pressure ratio of a hydrogen gas containing water vapor generated from hydrogen and oxygen by catalytic action within a range which reduces the metal film and oxidizes the principal surface of the semiconductor substrate, and selectively oxidizing the principal surface of the semiconductor substrate by feeding the water-vapor-containing hydrogen gas to the principal surface of the semiconductor substrate heated at a predetermined temperature or the vicinity thereof, thereby improving the profile of sidewall end portions of the gate electrode impaired by the wet etching.

28. A process as described under item 27 above, wherein the conductive film is made of a polycrystalline silicon film, a metal nitride film deposited over the polycrystalline silicon film, and a metal film deposited over the metal nitride film.

29. A process as described under item 28 above, wherein the metal nitride film is made of WN or TiN, while the metal film is made of W, Mo or Ti.

30. A process as described under item 27 above, wherein the gate electrode has a gate length not greater than 0.25 μm.

31. A process as described under item 27 above, wherein the gate electrode is a gate electrode of a MISFET for the memory cell selection which constitutes a memory cell of a DRAM.

32. A process as described under item 27 above, wherein the semiconductor substrate is heated at 800 to 900° C.

33. A process as described under item 27 above, wherein selective oxidation of the principal surface of the semiconductor substrate is carried out by a single-wafer-process system.

34. A process as described under item 27 above, wherein selective oxidation of the principal surface of the semiconductor substrate is carried out by batch treatment.

Effects available by the typical aspects and features, among the embodiments disclosed in the present application, will next be described briefly.

According to the present invention, in gate processing using a poly-metal, oxidation of a metal film at the time of light oxidation treatment subsequent to gate patterning can be prevented and, at the same time, the reproducibility of oxide film formation and the homogeneity of the oxide film thickness at the side wall end portions of a gate can be controlled favorably. In particular, an ultra-thin gate oxide film which has a film thickness not greater than 5 nm, which has improved pressure resistance and a high quality, can be formed with a uniform thickness and good reproducibility, which brings about an improvement in the reliability and production yield of a device which has a circuit formed of a fine MOSFET having a gate length of 0.25 μm or less.

BRIEF DESCRIPTION OF THE DRAWINGS

FIG. 4 is a fragmentary cross-sectional view of a semiconductor substrate which illustrates a step in the fabrication process of a DRAM according to one embodiment of the present invention;

FIG. 5 is a fragmentary cross-sectional view of a semiconductor substrate which illustrates a step in the fabrication process of a DRAM according to one embodiment of the present invention;

FIG. 8 is a fragmentary cross-sectional view of a semiconductor substrate which illustrates a step in the fabrication process of a DRAM according to one embodiment of the present invention;

FIG. 11 is a schematic diagram illustrating an apparatus for generating a water-vapor/hydrogen mixed gas by a catalytic system;

DETAILED DESCRIPTION OF THE PREFERRED EMBODIMENTS

Figure 1:
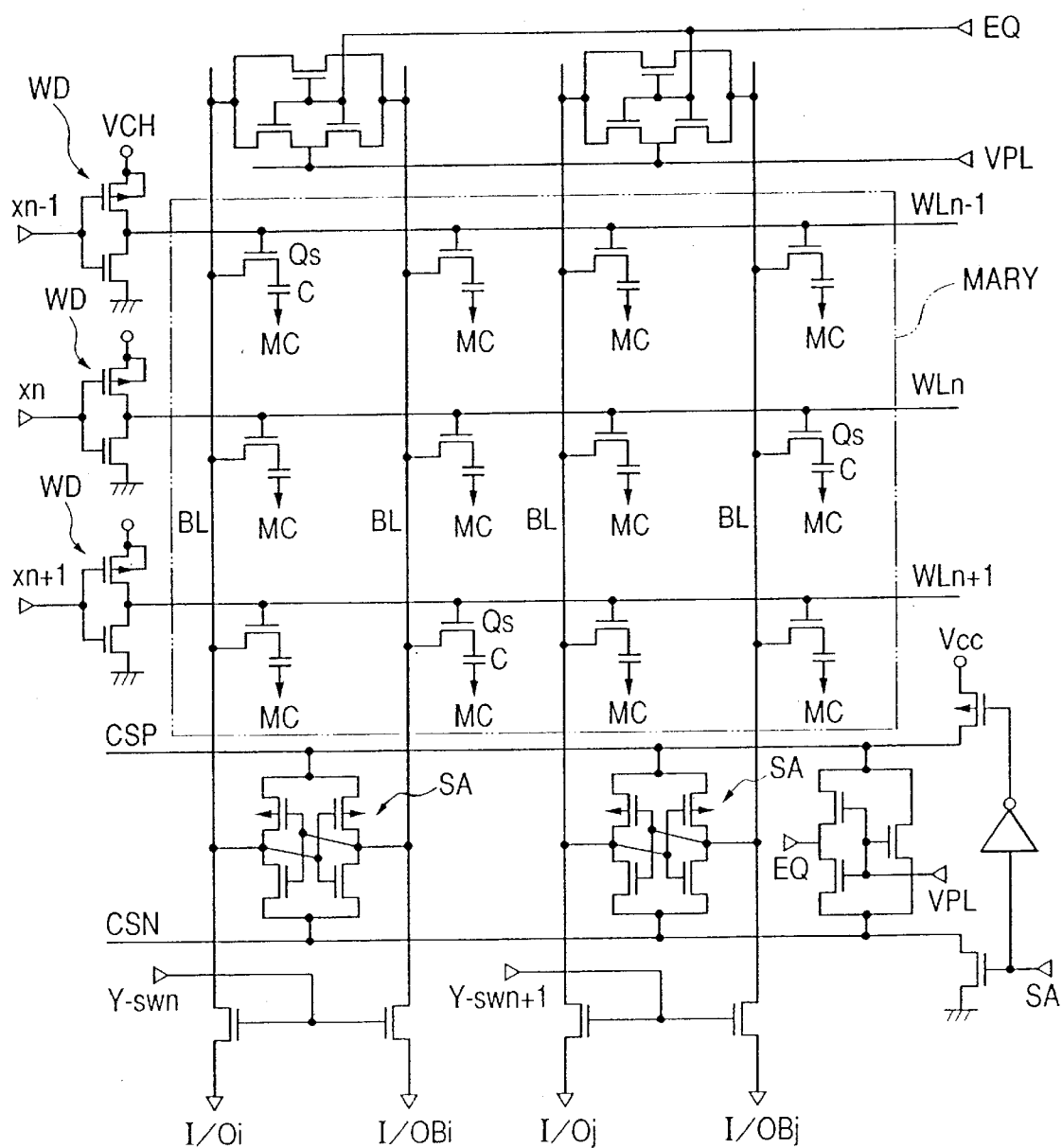
FIG. 1 is a circuit diagram of an equivalent of a DRAM according to one embodiment of the present invention.

The present invention will hereinafter be described more specifically with reference to the accompanying drawings. Incidentally, in all the drawings for illustrating the various embodiments, elements having a like function will be identified by like reference numerals and overlapping thereof descriptions will be omitted.

The term "semiconductor integrated circuit device" used herein means any devices, including not only those formed over a silicon wafer, but also those formed over a substrate such as TFT liquid crystal, unless otherwise specifically indicated. Accordingly, the term "semiconductor wafer" means not only a silicon single-crystal wafer, but also those having a silicon epitaxial layer or the like formed over a silicon single-crystal substrate or insulator substrate.

In the below-described examples, the same or similar descriptions will not be repeated in principle unless otherwise particularly required for an understanding of the invention.

If necessary for convenience, the below-described examples will be explained, in plural sections or as plural examples. However, it is to be understood that the examples relate to each other, and one section or example may represent a modification example, details or a complementary description of one or a whole portion of another section or example.

In the below-described examples, reference is made to the number of elements (including the number, numerical value, quantity and range). The number of the elements, however, is not limited to a specific number and elements may be used in a number less or greater than the specific number unless otherwise particularly indicated or apparently limited to a specific number in principle.

Furthermore in the below-described examples, it is obvious that constituting elements (including elemental steps or the like) are not always indispensable unless otherwise particularly specified or unless otherwise presumed to be apparently indispensable in principle.

Similarly, when reference is made to the shape, positional relationship or the like of constituting elements, those characteristics substantially close or similar to such shapes or the like are included, unless otherwise specifically indicated or presumed to be apparently different in principle. This also applies to the above-described numerical value and range.

FIG. 1 illustrates an equivalent circuit of a DRAM according to one embodiment of the present invention. As illustrated, the memory array (MARY) of this DRAM is equipped with a plurality of word lines WL ($WL_{n-1}$, $WL_n$, $WL_{n+1}$ . . . ) and a plurality of bit lines BL disposed in a matrix pattern, and a plurality of memory cells (MC) disposed at their intersections. One memory cell for the storage of one-bit information is formed of one capacitative element C for information storage and one MISFETQs for memory cell selection connected in series thereto. One of a source and drain of the MISFETQs for memory cell selection is electrically connected with the capacitative element C for information storage and the other one is electrically connected with a bit line BL. One end of a word line WL is connected with a word driver WD and one end of a bit line is connected with a sense amplifier SA.

A description will next be made of the fabrication process of DRAM according to the embodiment of the present invention with reference to FIGS. 2 to 24. Each of FIGS. 2 to 8 and FIGS. 14 to 24 is a cross-sectional view illustrating parts of a memory array (MARY) and a peripheral circuit (ex. sense amplifier SA); and each of FIGS. 9 and 10 is a schematic view illustrating a single-wafer-process type oxidizing furnace to be used for the light oxidation treatment.

FIG. 11 is a schematic view illustrating a water vapor/hydrogen mixed gas generating apparatus, which adopts a catalytic system, connected with a chamber of the single-wafer-process type oxidizing furnace.

Figure 12:
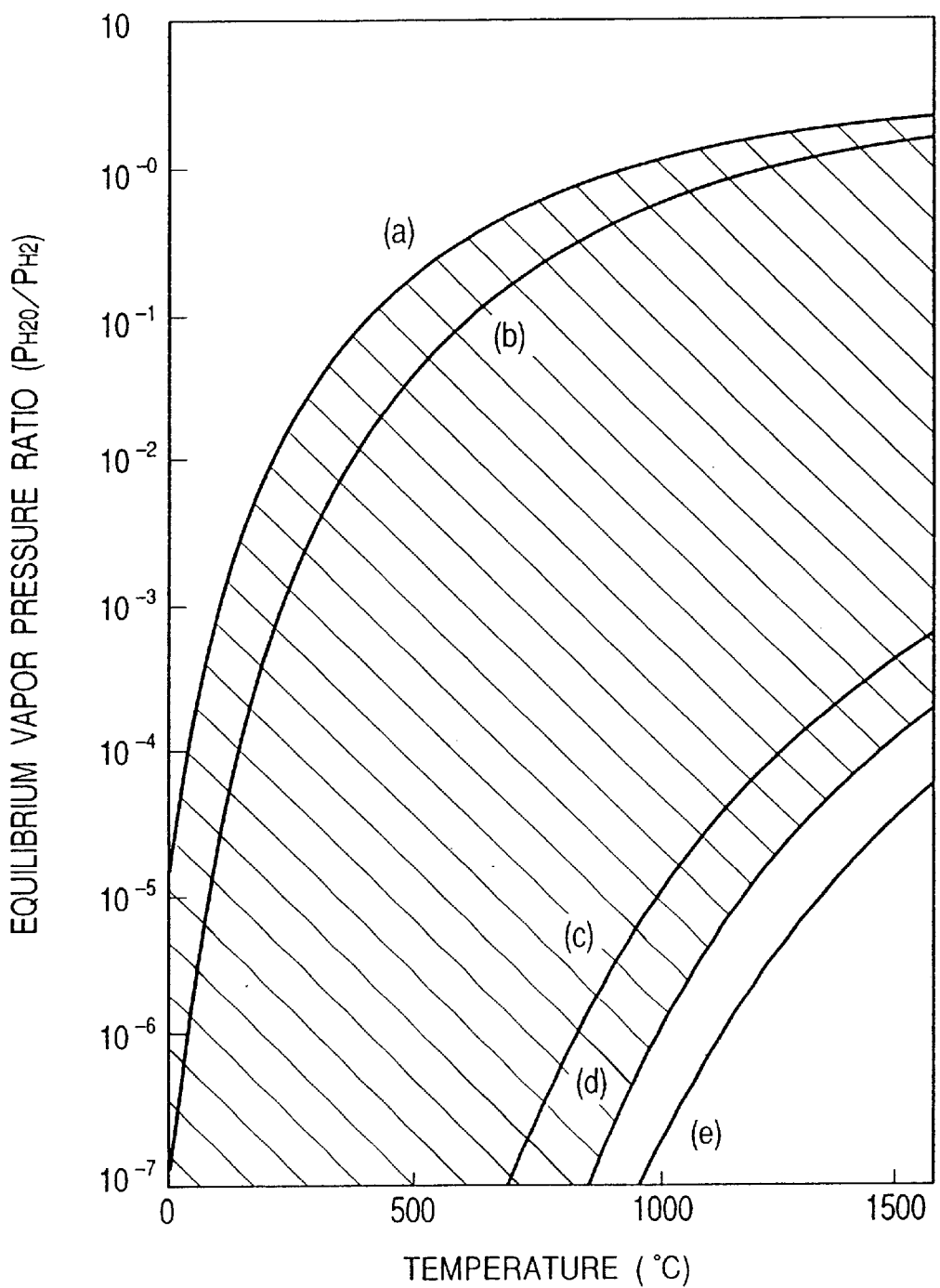
FIG. 12 is a graph illustrating temperature dependence of a equilibrium vapor pressure ratio in redox reaction using a water vapor/hydrogen mixed gas.
Figure 13:
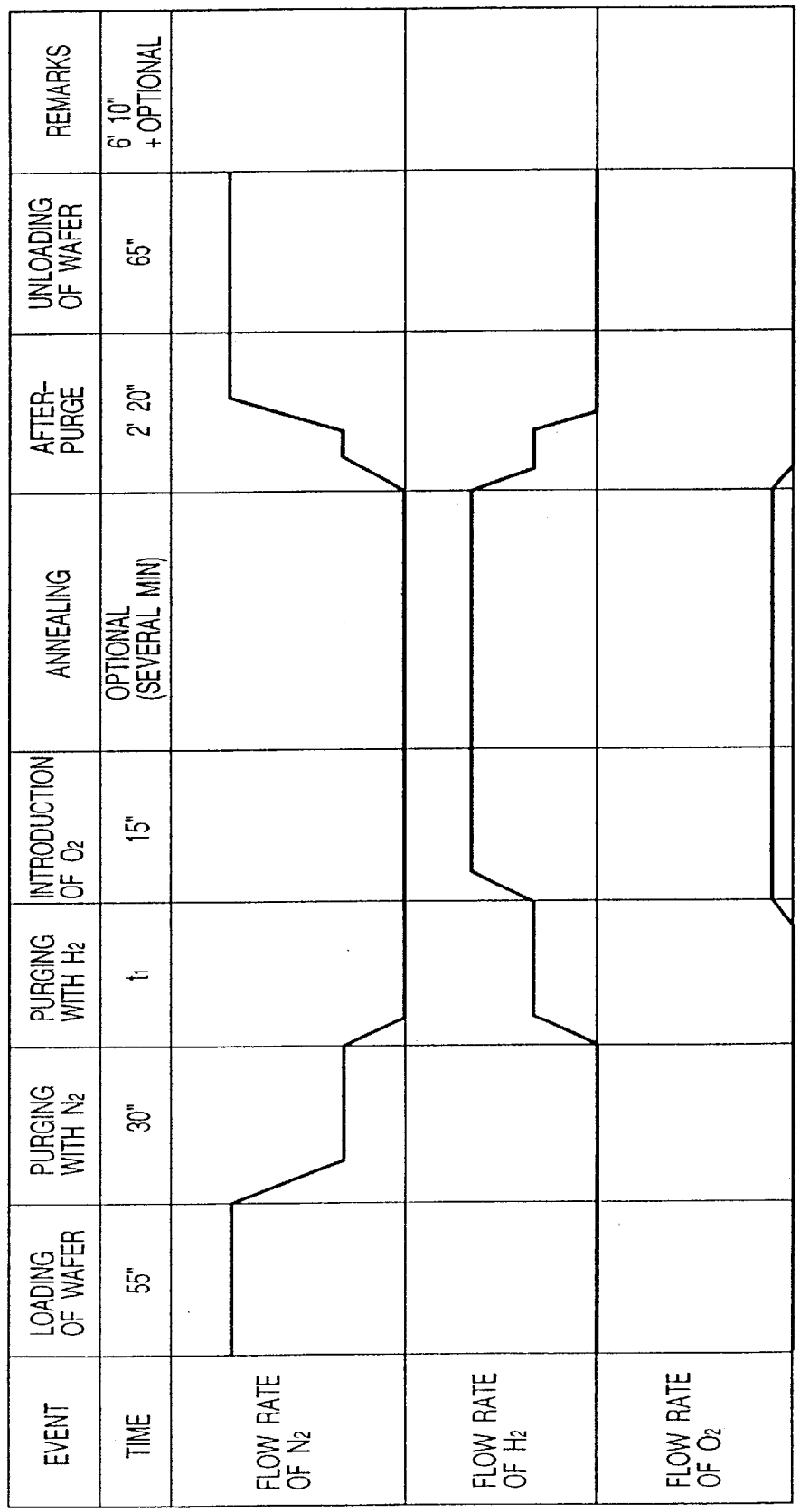
FIG. 13 is a diagram which illustrates a sequence of a light oxidation process using a single-wafer-process system.

FIG. 12 is a graph illustrating temperature dependence of an equilibrium vapor pressure ratio of redox reaction using a water vapor/hydrogen mixed gas; and FIG. 13 illustrates a sequence of the light oxidation process using a single-wafer-process type oxidizing furnace. It should be borne in mind that the film thickness and the like used in the following description will be offered by way of illustration, but not by way of limitation.

Figure 2:
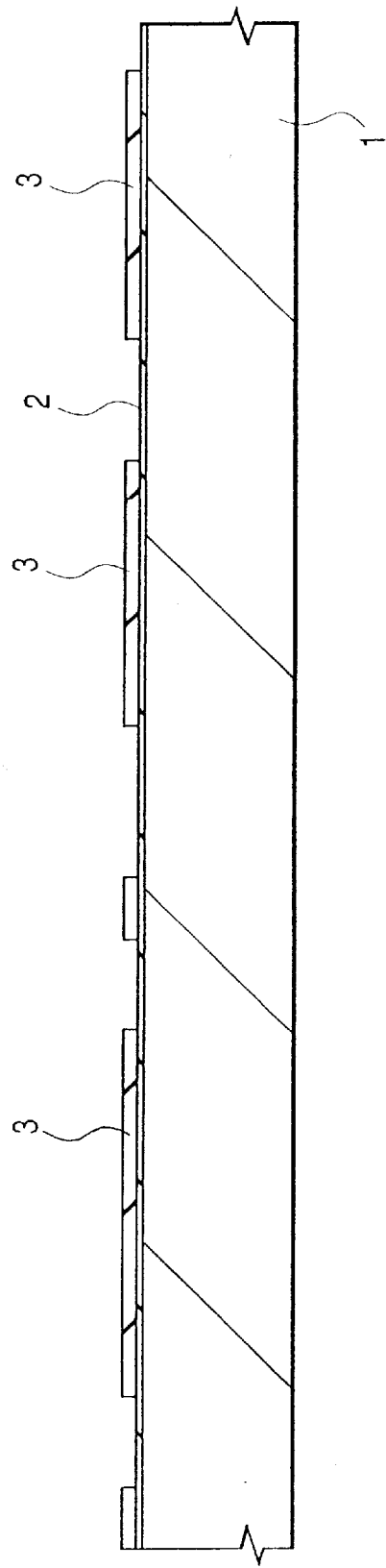
FIG. 2 is a fragmentary cross-sectional view of a semiconductor substrate which illustrates a step in the fabrication process of a DRAM according to one embodiment of the present invention.

First, as illustrated in FIG. 2, a semiconductor substrate 1 made of single crystal silicon having a specific resistance of about 10 Ωcm is heat treated to form a thin silicon oxide film 2 (pad oxide film) having a film thickness of about 10 nm over the principal surface of the substrate. Then, a silicon nitride film 3 having a film thickness of about 100 nm is deposited over the silicon oxide film 2 by the CVD (Chemical Vapor Deposition) method. The silicon nitride film 3 of an element isolation region is removed by etching using a photoresist film as a mask. The silicon oxide film 2 is formed in order to relax a stress to be added to the substrate when another silicon oxide film to be embedded inside of an element isolating groove is densified (sintered) later. The silicon nitride film 3 is resistant to oxidation so that it is used as a mask for preventing the oxidation of the surface of the substrate below the silicon nitride film (active region).

Figure 3:
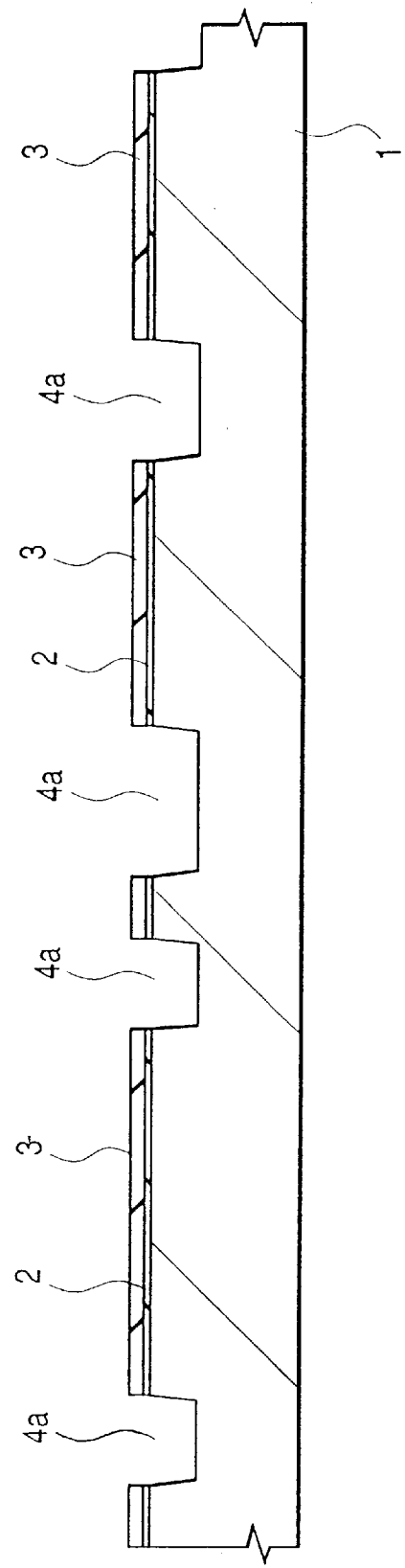
FIG. 3 is a fragmentary cross-sectional view of a semiconductor substrate which illustrates a step in the fabrication process of a DRAM according to one embodiment of the present invention.

As illustrated in FIG. 3, the silicon oxide film 2 and semiconductor substrate 1 are dry etched using the silicon nitride film 3 as a mask, whereby a groove 4a (element isolating groove) having a depth of about 300 to 400 nm is formed in an element isolating region of the semiconductor substrate 1.

As illustrated in FIG. 4, in order to remove a damaged layer formed on an inside wall of the groove 4a produced by the above-described etching, the semiconductor substrate 1 is heat treated to form a silicon oxide film 5 having a film thickness of about 10 nm on the inside wall of the groove 4a. Then, over the semiconductor substrate 1, a silicon oxide film 6 is deposited by the CVD method (embedded from outside with an embedding material). Instead of the CVD method, SOG or the like method can be employed for the formation of an insulation film. For the improvement of the film quality of the silicon oxide film 6, the semiconductor substrate 1 is heat treated to densify (sinter) the silicon oxide film 6. With the silicon nitride film 3 as a stopper, the silicon oxide film 6, except for the inside of the groove 4a, is polished by the chemical mechanical polishing (CMP) method, whereby an element isolation groove 4 is formed. (It is needless to say that the term "chemical mechanical polishing" as used herein refers not only to polishing by use of suspended abrasives, but also includes mechanical flattening of the element formation surface.)

In the next place, the silicon nitride film 3 remaining on the semiconductor substrate 1 is removed by wet etching with hot phosphoric acid. Ions (boron) are then implanted to a region (memory array) in which a memory cell is to be formed and to a region (n-channel type MISFETQn) in which a portion of a peripheral circuit is to be formed, each over the semiconductor substrate 1, whereby a p-type well 7 is formed. On the other hand, P (phosphorus) ions are implanted to a region in which another portion of the peripheral circuit (p-channel type MISFETQP) is to be formed, whereby an n-type well 8 is formed.

Figure 6:
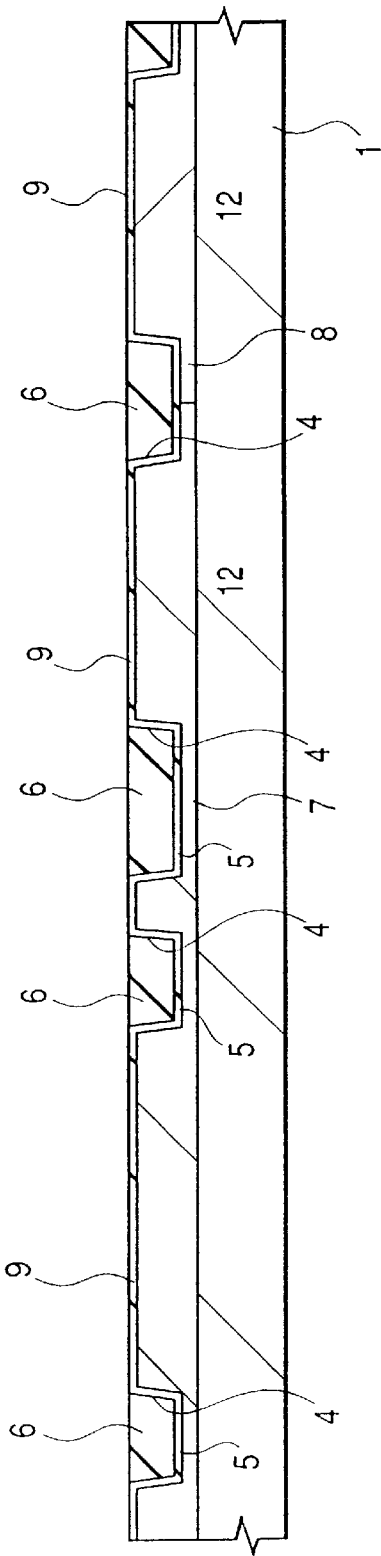
FIG. 6 is a fragmentary cross-sectional view of a semiconductor substrate which illustrates a step in the fabrication process of a DRAM according to one embodiment of the present invention.

As illustrated in FIG. 6, the silicon oxide film 2 over the surfaces of the p-type well 7 and n-type well 8 is removed using an HF (hydrofluoric acid) type detergent. Then, the semiconductor substrate 1 is wet oxidized, whereby a clean gate oxide film 9 having a thickness of 5 nm or so is formed over the surfaces of the p-type well 7 and n-type well 8.

Although no particular limitation is imposed, oxidation and nitriding treatment for the segregation of nitrogen at the interface between the gate oxide film 9 and semiconductor substrate 1 may be carried out after the formation of the gate oxide film 9 by thermally treating the semiconductor substrate 1 in an NO (nitrogen oxide) or $N_2O$ (dinitrogen monoxide) atmosphere. When the gate oxide film 9 becomes as thin as about 5 nm, distortion occurring at the interface due to the difference in a thermal expansion coefficient between the gate oxide film 9 and the semiconductor substrate 1 becomes apparent, which induces the generation of hot carriers. Segregation of nitrogen at the interface with the semiconductor substrate 1 relaxes the above distortion so that the above oxidation and nitriding treatment brings about an improvement in the reliability of the ultra-thin gate oxide film 9.

Figure 7:
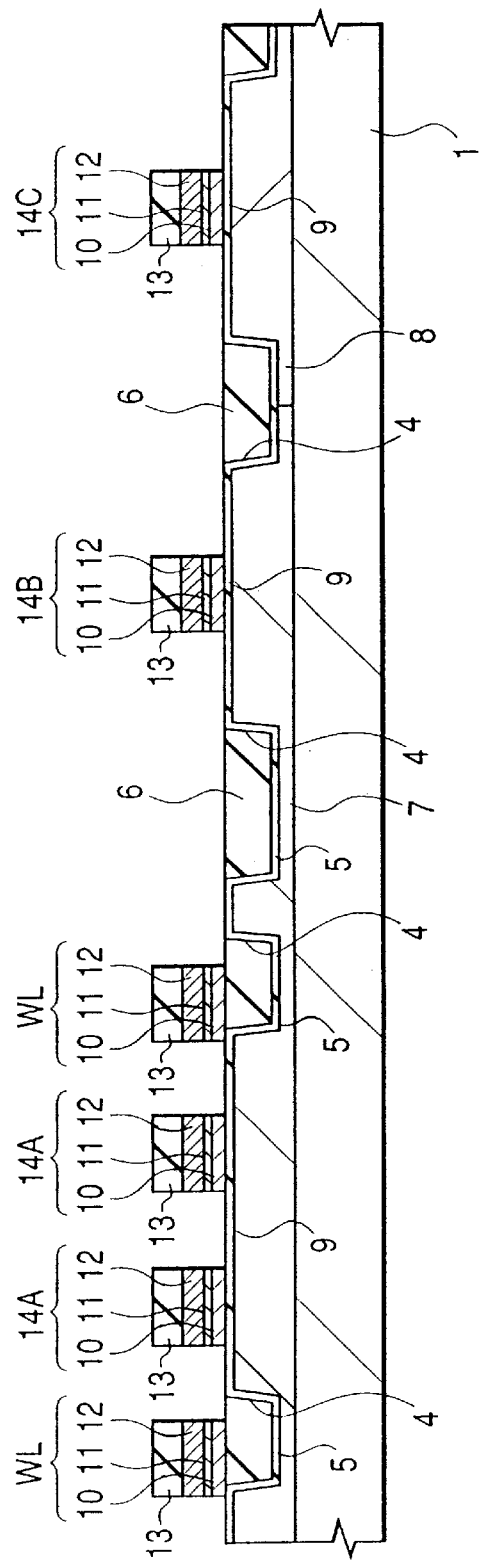
FIG. 7 is a fragmentary cross-sectional view of a semiconductor substrate which illustrates a step in the fabrication process of a DRAM according to one embodiment of the present invention.

As illustrated in FIG. 7, a gate electrode 14A (word line WL) and gate electrodes 14B, 14C, each having a gate length of about 0.25 $\mu$m, are formed over the gate oxide film 9. The gate electrode 14A (word line WL) and gate electrodes 14B, 14C are formed by depositing, by CVD, over the semiconductor substrate 1, a polycrystalline silicon film 10 of about 70 nm thickness in which n-type impurities such as P (phosphorus) have been doped, depositing thereon a WN film 11 of about 30 nm thickness and a W film 12 of about 100 nm thickness by sputtering, depositing thereon a silicon nitride film 13 of about 150 nm thickness and then patterning these films using a photoresist as a mask.

When a portion of the gate electrode 14A (word line WL) is formed of a low-resistance metal (W), its sheet resistance can be reduced even to 2 $\Omega/\square$, which makes it possible to reduce the word line delay. In addition, the delay of the word line can be reduced without lining the gate electrode 14 (word line WL) with an AL interconnection or the like so that the number of the interconnection layers to be formed over the memory cell can be reduced by one.

Then, the photoresist is removed by ashing treatment, followed by removal of the dry etching residue or ashing residue on the semiconductor substrate 1 by an etching liquid such as hydrofluoric acid. By this wet etching, as illustrated in FIG. 8, the gate oxide film 9 of the regions other than those below the gate electrode 14A (word line WL) and not-illustrated gate electrodes 14B, 14C, and also the gate oxide film 9 at the lower portions of the side walls of the gate, are isotropically etched and undercuts appear, leading to an inconvenience, such as lowering of the pressure resistance of the gate oxide film 9. Here, re-oxidation (light oxidation) treatment is carried out by the below-described process in order to regenerate the impaired gate oxide film 9.

Figure 9A:
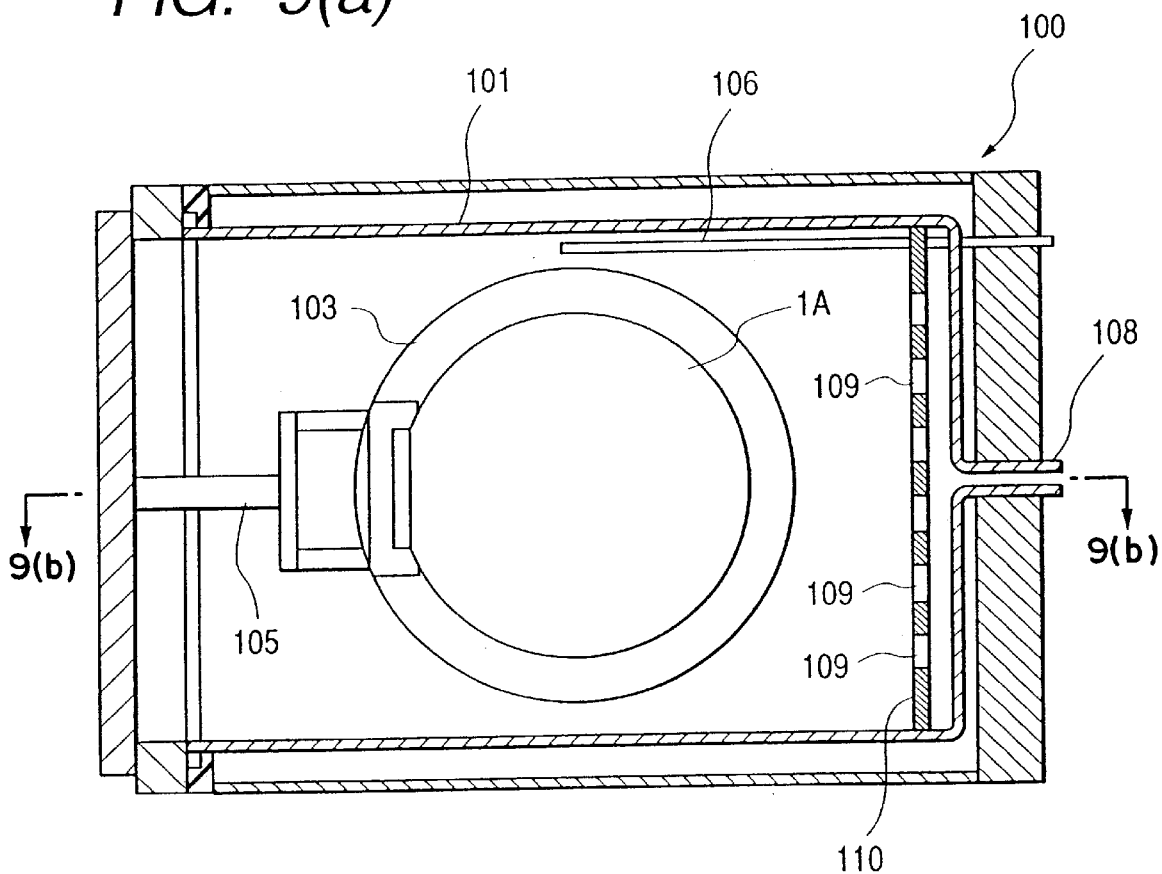
FIG. 9(a) is a schematic plan view illustrating a single-wafer-process type oxidizing furnace to be used for light oxidation treatment and FIG. 9(b) is a cross-sectional view taken along a line B–B' of FIG. 9(a)
Figure 9B:
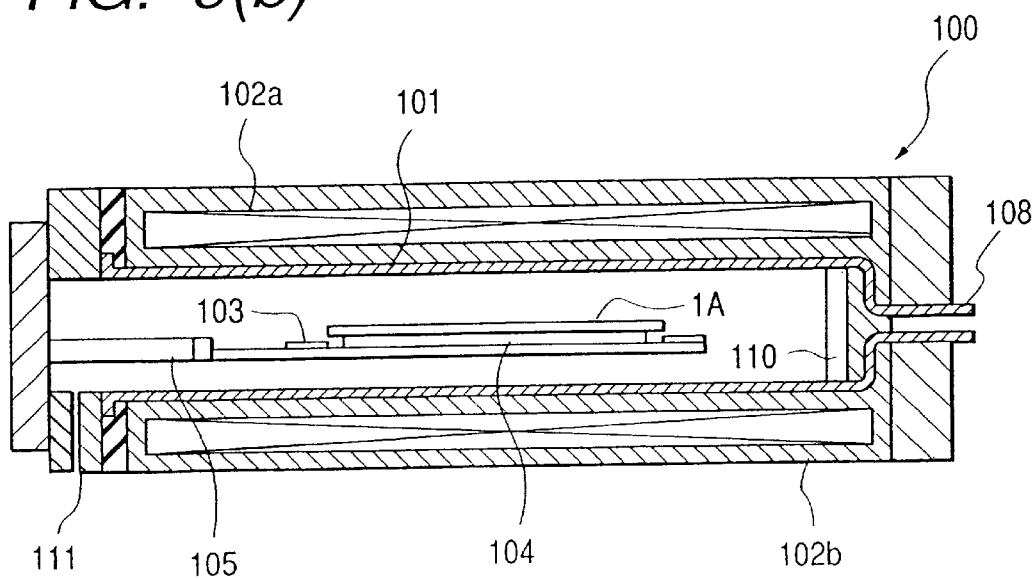
Figure 10A:
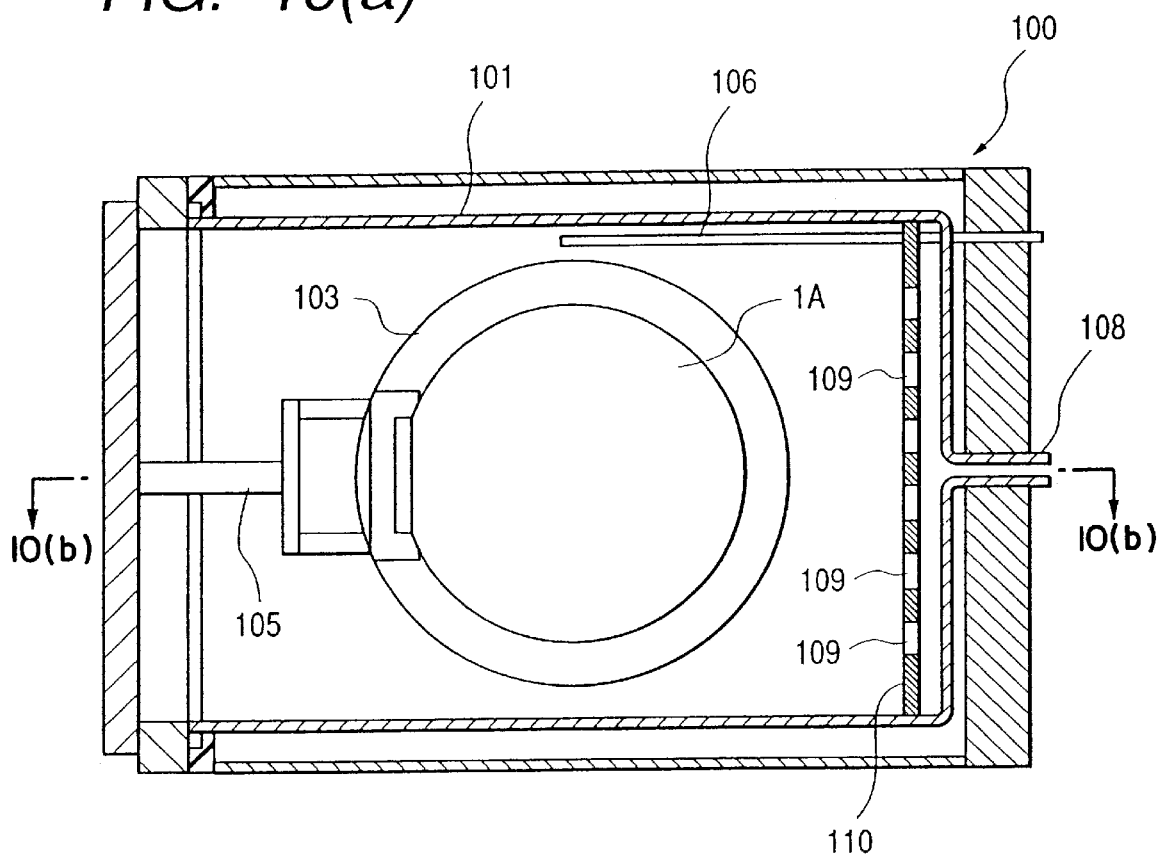
FIG. 10(a) is a schematic plan view illustrating a single-wafer-process type oxidizing furnace to be used for light oxidation treatment and FIG. 10(b) is a cross-sectional view taken along a line B–B' of FIG. 10(a)
Figure 10B:
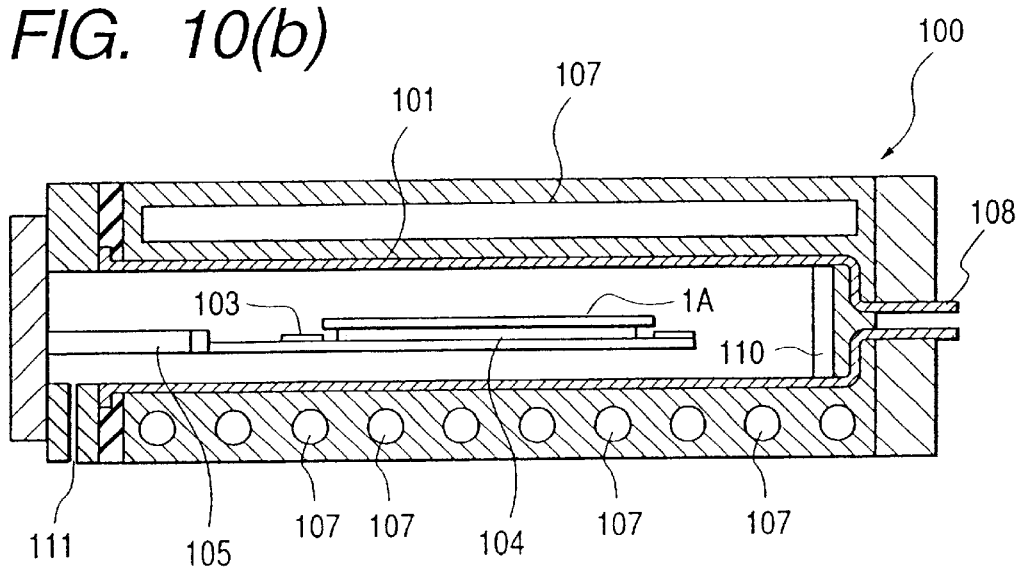

FIG. 9(a) is a schematic plan view illustrating one example of a specific constitution of a single-wafer-process type oxidizing furnace to be used for the light oxidation treatment, and FIG. 9(b) is a cross-sectional view taken along a line B–B' of FIG. 9(a).

The single-wafer-process type oxidizing furnace 100 is equipped with a chamber 101 made of a multiple-wall quartz tube, and above and below the chamber, heaters 102a and 102b are disposed for heating a semiconductor wafer 1A, respectively. Inside the chamber 101, a disk-shaped soaking ring 103 is housed for uniformly dispersing the heat supplied from the heaters 102a, 102b all over the semiconductor wafer 1A, and above the ring, a susceptor 104 for horizontally holding the semiconductor wafer 1A is disposed. The soaking ring 103 is made of a heat-resistant material, such as quartz or SiC (silicon carbide), and is supported by a supporting arm 105 which extends from the wall surface of the chamber 101. In the vicinity of the soaking ring 103 a thermocouple 106 is installed for measuring the temperature of the semiconductor wafer 1A supported by the susceptor 104. For heating of the semiconductor wafer 1Aa, heating system using a lamp 107 as illustrated in FIG. 10 may also be adopted, as well as the heating system using heaters 102a, 102b.

A portion of the side wall of the chamber 101 is connected with one end of a gas inlet tube 108 for introducing a water vapor/hydrogen mixed gas and purge gas into the chamber 101. The other end of this gas inlet tube 108 is connected with a catalytic system gas generator which will be described later. In the vicinity of the gas inlet tube 108, a partition 110 having many penetration holes 109 is disposed. The gases introduced into the chamber 101 passes through the penetration holes 109 of this partition 110 and spreads uniformly inside of the chamber 101. A portion of the opposite wall surface of the chamber 101 is connected with one end of an exhaust tube 111 for exhausting the above gases introduced into the chamber 101.

FIG. 11 is a schematic view illustrating a catalytic-system water vapor/hydrogen mixed gas generator connected with the chamber 101 of the above single-wafer-process type oxidizing furnace 100. This gas generator 140 is equipped with a reactor 141 made of a heat- and corrosion-resistant alloy (for example, Ni alloy known as "Hastelloy", trade name) and has therein a coil 142 made of a catalytic metal, such as Pt (platinum), Ni (nickel) or Pd (palladium), and a heater 143 for heating the coil 142.

Into the reactor 141, a process gas made of hydrogen and oxygen and a purge gas made of an inert gas, such as nitrogen or Ar (argon), are introduced from gas reservoirs 144a, 144b, 144c from a pipe 145. Between the gas reservoirs 144a, 144b and 144c and the pipe 145, mass flow controllers 146a, 146b and 146c are disposed for adjusting the amount of gases and switching valves 147a, 147b and 147c for opening or closing the passage of the gases, respectively, by which the amount and component ratio of the gases introduced into the reactor 141 are controlled precisely.

The process gas (hydrogen and oxygen) introduced into the reactor 141 is excited, being brought into contact with the coil 142 heated to about 350 to 450° C., whereby a hydrogen radical is formed from a hydrogen molecule ($H_2 \rightarrow 2H^*$) and an oxygen radical is formed from an oxygen molecule ($O_2 \rightarrow 2O^*$). These two radicals are so chemically active that they react rapidly and form water ($2H^* + O^* \rightarrow H_2O$). The introduction of a process gas containing more hydrogen than the molar ratio (hydrogen : oxygen= 2:1) at which water (water vapor) is formed into the reactor 141 generates a water vapor/hydrogen mixed gas. The mixed gas so formed is introduced into the chamber 101 of the single-wafer-process type oxidizing furnace 100 through the gas inlet tube 108.

By the use of such a catalytic-system gas generator 140, the amount and ratio of hydrogen and oxygen which take part in the formation of water can be controlled with high precision, which makes it possible to control the concentration of water vapor contained in the water vapor/hydrogen mixed gas introduced in the chamber 101 within a wide range from a markedly low concentration on the order of ppm to a concentration as high as ten-odd %. Further, the water formation occurs just after the introduction of a process gas into the reactor 141 so that a water vapor/hydrogen mixed gas having a desired concentration can be obtained in real time. When the above generator is used, the mixing of foreign matter can be suppressed to a minimum so that a clean water vapor/hydrogen mixed gas can be introduced into the chamber 101. The catalyst metal in the reactor 141 is not limited to the above-described metal the only requirement being the ability to convert hydrogen and oxygen into their radicals. In addition to the use of a catalyst metal in a coil form, it can be processed into a hollow tube or fine fiber filter, through which a process gas is allowed to pass.

FIG. 12 is a graph illustrating temperature dependence of an equilibrium vapor pressure ratio ($P(H_2O)/P(H_2)$) of redox reaction using a water vapor/hydrogen mixed gas, in which curves (a) to (e) represent equilibrium vapor pressure ratios of W, Mo, Ta (tantalum), Si and Ti, respectively.

As is illustrated, by setting the water vapor/hydrogen partial pressure ratio of the water vapor/hydrogen mixed gas to be introduced into the chamber 101 of the single-wafer-process oxidizing furnace 100 within a range of the region surrounded by the curves (a) and (d), only Si can be selectively oxidized without oxidizing the W film 12 and barrier WN film 11, which constitute a portion of the gate electrode 14A (word line WL) and gate electrodes 14B, 14C. Furthermore, as illustrated, the lower the water vapor concentration in the water vapor/hydrogen mixed gas, the slower will be the oxidizing rate of any one of metals (W, Mo, Ta, Ti) and Si. It is therefore possible to control the oxidizing rate and oxide film thickness of Si easily by lowering the water vapor concentration in the water vapor/hydrogen mixed gas.

Similarly, when a portion of the gate electrode is formed of an Mo film, only Si can selectively be oxidized without oxidizing the Mo film by setting the water vapor/hydrogen partial pressure ratio within a range of the region surrounded by the curves (b) and (d). When a portion of the gate electrode is formed by a Ta film, only Si can selectively be oxidized without oxidizing the Ta film by setting the water vapor/hydrogen partial pressure ratio within a range of the region surrounded by curves (c) and (d).

As is illustrated, on the other hand, when a portion of the gate electrode is formed of a Ti film or the barrier layer is formed of a TiN film, the selective oxidation of only Si cannot be attained without oxidizing the Ti film or TiN film because the oxidizing rate of Ti is greater than that of Si in a water vapor/hydrogen mixed gas atmosphere. In this case, however, it is possible to suppress deterioration of the properties of the gate electrode to a negligible range from the viewpoint of practical applications by setting the concentration of water vapor in the water vapor/hydrogen mixed gas at a low concentration, thereby suppressing the oxidation of the Ti film or TiN film to a minimum. More specifically, it is desirable to suppress the upper limit of the water vapor concentration to about 1% or less and to set the lower limit to about 10 ppm to 100 ppm, because water vapor is required to some extent for improving the profile of the side-wall end portions of the gate electrode.

A description will next be made of one example of the sequence of the light oxidation process using the above-described single-wafer-process oxidizing furnace 100, with reference to FIG. 13.

First, the chamber 101 of the single-wafer-process oxidizing furnace 100 is opened, and while a purge gas (nitrogen) is introduced inside of the chamber, the semiconductor wafer 1A is loaded on the susceptor 104. The chamber 101 is then closed and gas exchange inside of the chamber 101 is carried out sufficiently by the continuous introduction of the purge gas. The susceptor 104 is heated in advance by the heaters 102a and 102b so that the semiconductor wafer 1A can be heated rapidly. The semiconductor wafer 1A is heated at a temperature range of from 800 to 900° C., for example, 850° C. Wafer temperatures lower than 800° C. deteriorate the quality of the silicon oxide film, while those higher than 900° C. tend to cause surface roughness of the wafer.

Next, hydrogen is introduced into the chamber 101, while nitrogen is discharged. It is desired to discharge nitrogen completely because nitrogen remaining in the chamber 101 happens to cause an undesirable nitriding reaction.

Then, oxygen and excess hydrogen are introduced into the reactor 141 of the gas generator 140, followed by the introduction of water generated from oxygen and hydrogen by catalytic action into the chamber 101 together with excess hydrogen, whereby the surface of the semiconductor wafer 1A is oxidized for a predetermined time. By this oxidation, the gate oxide film 9, which becomes thin due to the above-described wet etching, can be oxidized again, which brings about an improvement in the profile of the undercut side-wall end portions of the gate electrode 14A (word line WL) and gate electrodes 14B, 14C.

When the above-described light oxidation is effected for long hours, the oxide film thickness in the vicinity of the end portion of the gate electrode becomes unnecessarily thick, which produces an offset at the end portion of the gate electrode or a deviation of the threshold voltage (Vth) of MOSFET from the designed value. In addition, it is sometimes accompanied with the problem that the effective channel length becomes shorter than the processed value of the gate electrode. In a minute MOSFET having a gate length of about 0.25 μm, thinning tolerance from the designed value of gate processing size is severely limited from the viewpoint of the device design. This is because only a slight increase in the thinning amount causes a drastic decrease in the threshold voltage owing to short channel effects. In the case of a gate electrode having a gate length of about 0.25 μm, the degree of oxidation, in the light oxidation process, of the side-wall end portion of a polycrystalline silicon film constituting a part of the gate electrode in an amount of about 0.1 μm (about 0.2 μm in total of both end portions) is presumed to be a limitation which does not cause a drastic decrease in the threshold voltage. Accordingly, it is desirable to set the upper limit of the oxide film thickness grown by light oxidation to about a 50% increase of the gate oxide film thickness.

After the water vapor/hydrogen mixed gas is discharged by introducing a purge gas (nitrogen) into the chamber 101, the chamber 101 is opened. While a purge gas is introduced inside of the chamber 101, the semiconductor wafer 1A is unloaded from the susceptor 104, whereby the light oxidation treatment is completed.

Figure 14:
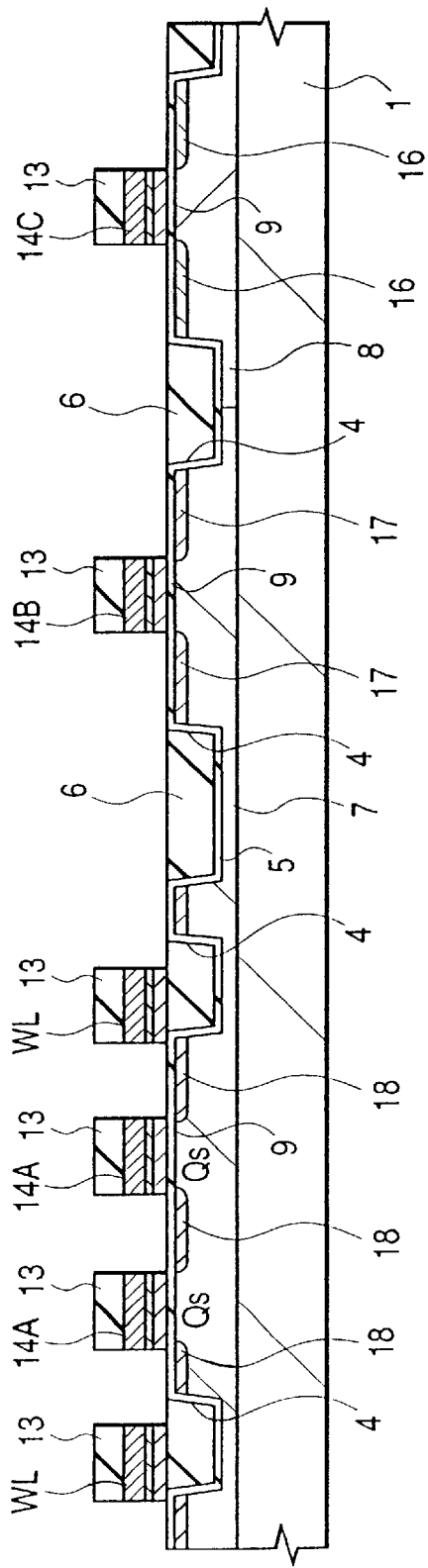
FIG. 14 is a fragmentary cross-sectional view of a semiconductor substrate illustrating a step in the fabrication process of a DRAM according to one embodiment of the present invention.

Next, the DRAM process subsequent to the light oxidation process will be described simply. First, as illustrated in FIG. 14, p-type impurities such as B (boron) are ion-implanted to the n-type well 8, whereby p-type semiconductor regions 16 are formed in the n-type well 8 on both sides of the gate electrode 14C. On the other hand, n-type impurities such as P (phosphorus) are ion-implanted to the p-type well 7, whereby n-type semiconductor regions 17 are formed in the p-type well 7 on both sides of the gate electrode 14B and n-type semiconductor regions 18 are formed in the p-type well 7 on both sides of the gate electrode 14A.

Figure 15:
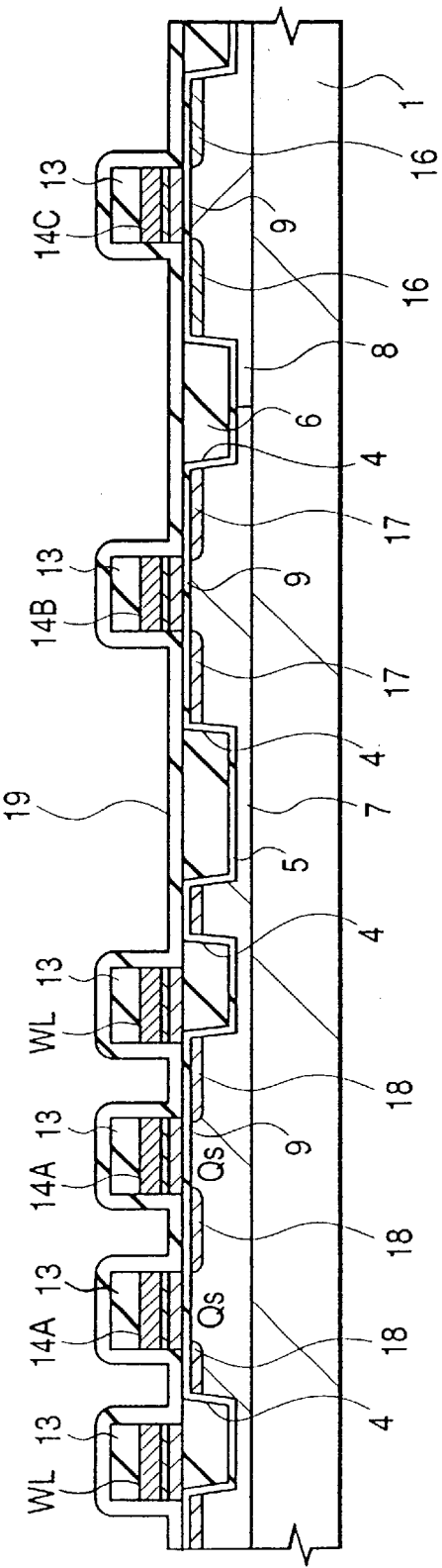
FIG. 15 is a fragmentary cross-sectional view of a semiconductor substrate illustrating a step in the fabrication process of a DRAM according to one embodiment of the present invention.
Figure 16:
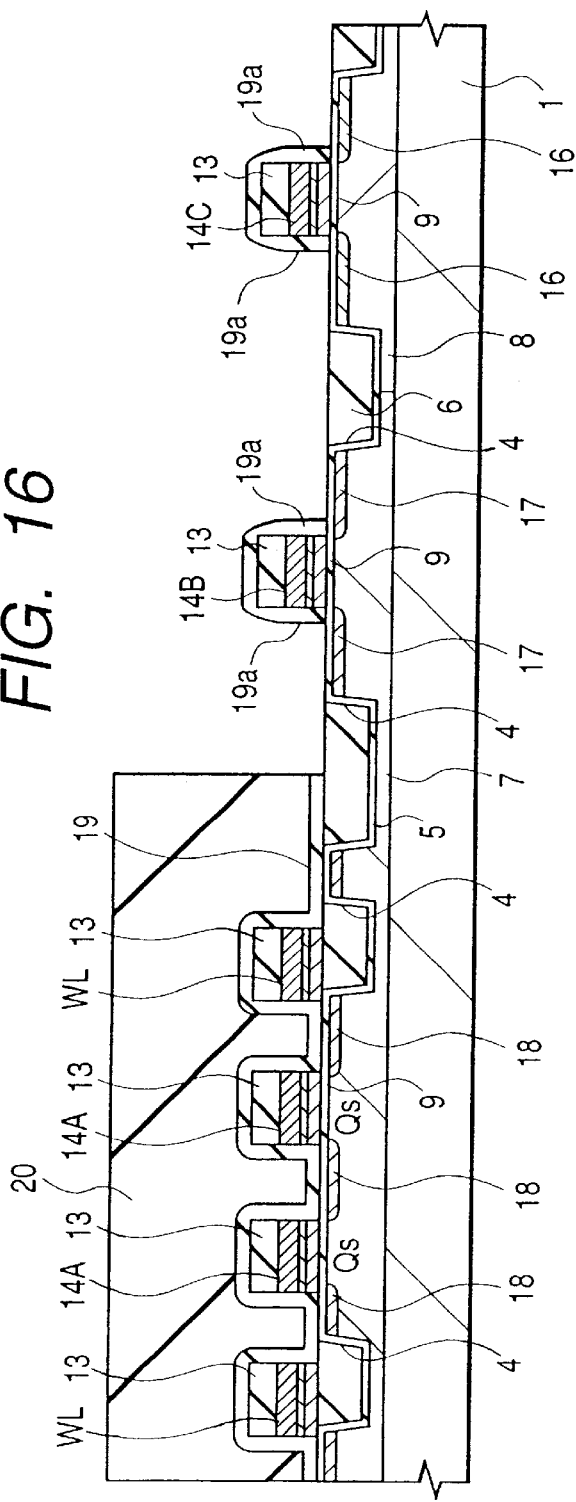
FIG. 16 is a fragmentary cross-sectional view of a semiconductor substrate illustrating a step in the fabrication process of a DRAM according to one embodiment of the present invention.

As illustrated in FIG. 15, a silicon nitride film 19 is deposited over the semiconductor substrate 1 by the CVD method. As illustrated in FIG. 16, the memory array is then covered with a photoresist film 20, and by anisotropic etching of the silicon nitride film 19 of the peripheral circuit, side wall spacers 19a are formed on the side walls of the gate electrodes 14B, 14C. Upon carrying out this anisotropic etching, the over etching amount is suppressed to a minimum and at the same time, an etching gas which permits a large selection ratio to the silicon oxide film 6 is employed, for the purpose of suppressing the cut amount of the silicon oxide film 6 embedded in the element separating groove 4 and that of the silicon nitride film 19 over the gate electrodes 14B and 14C to a minimum.

Figure 17:
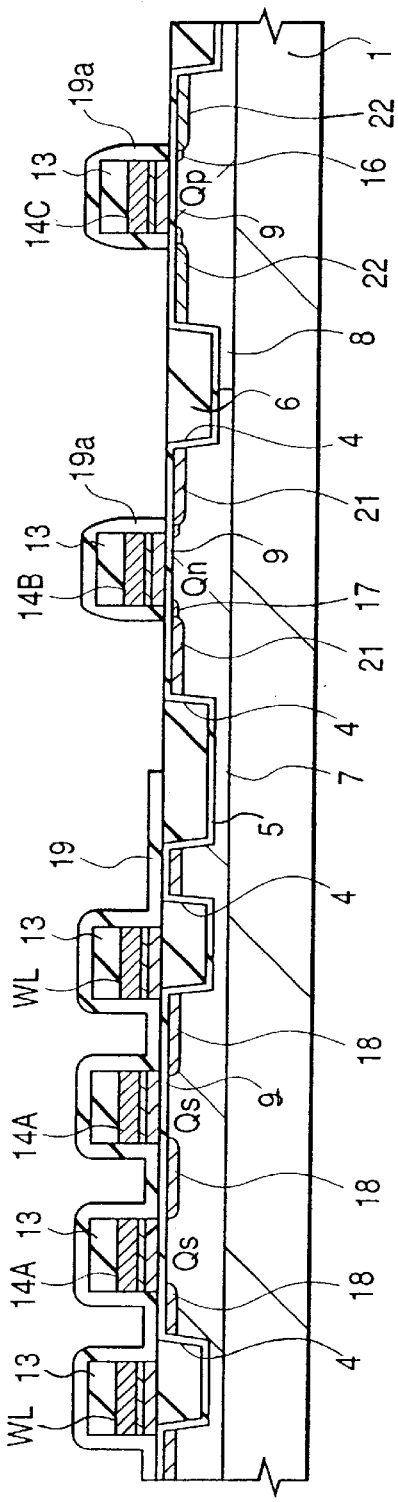
FIG. 17 is a fragmentary cross-sectional view of a semiconductor substrate illustrating a step in the fabrication process of a DRAM according to one embodiment of the present invention.

As illustrated in FIG. 17, n-type impurities, for example, As (arsenic) are ion-implanted to the p-type well 7 of the peripheral circuit, whereby an n+ type semiconductor region 21 (source, drain) of an n-channel type MISFETQn is formed. On the other hand, p-type impurities, for example, B (boron) are ion-implanted to the n-type well 2, whereby a p+ type semiconductor region 22 (source, drain) of a p-channel type MISFETQp is formed.

Figure 18:
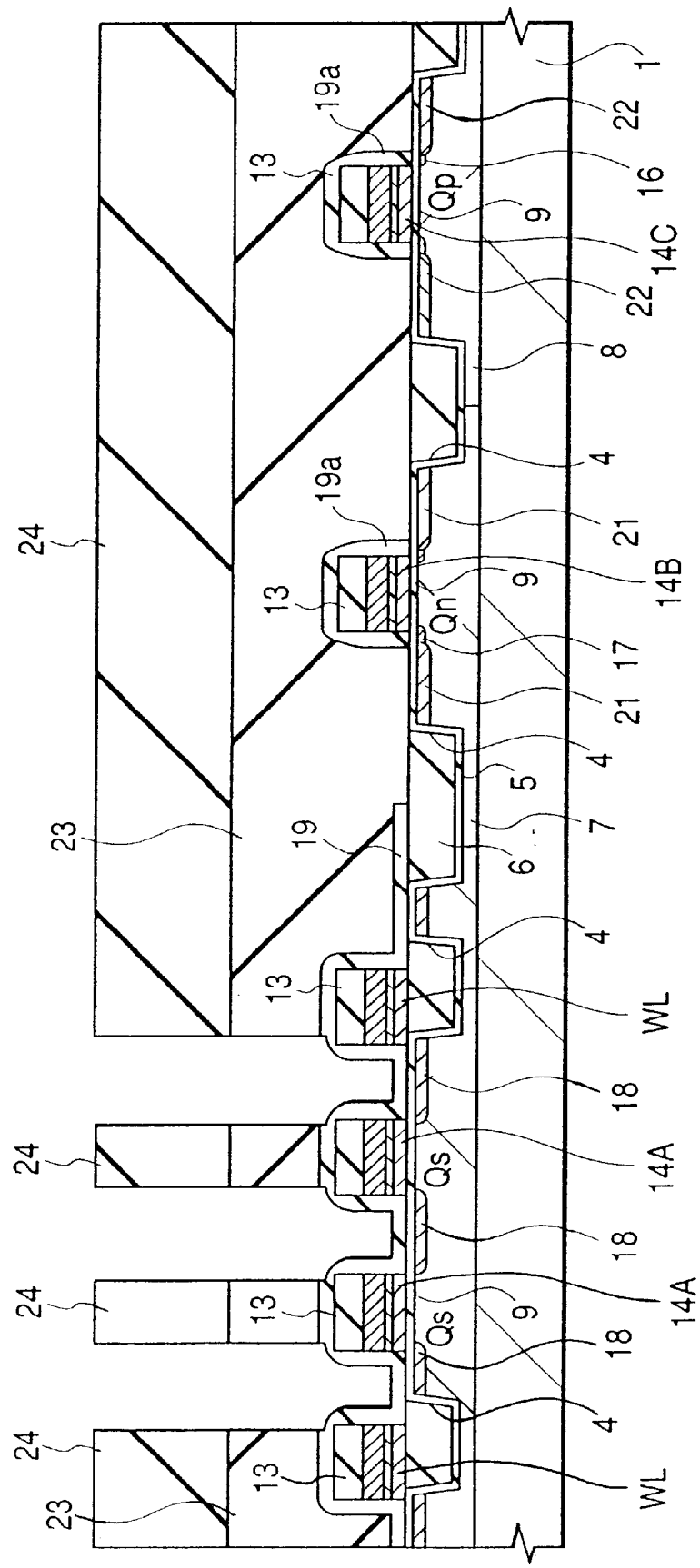
FIG. 18 is a fragmentary cross-sectional view of a semiconductor substrate illustrating a step in the fabrication process of a DRAM according to one embodiment of the present invention.

As illustrated in FIG. 18, a silicon oxide film 23 is deposited over the semiconductor substrate 1 by the CVD method, followed by flattening of the surface by the chemical mechanical polishing method. The silicon oxide film 23 over the n-type semiconductor regions 18 (source, drain) of MISFETQs for memory cell selection is then removed by dry etching using with a photoresist film 24 as a mask. This etching is carried out under conditions in which the etching rate of the silicon oxide film 23 becomes greater than that of the silicon nitride films 13, 19, whereby the removal of the silicon nitride film 19 over the n-type semiconductor region 18 can be prevented.

Figure 19:
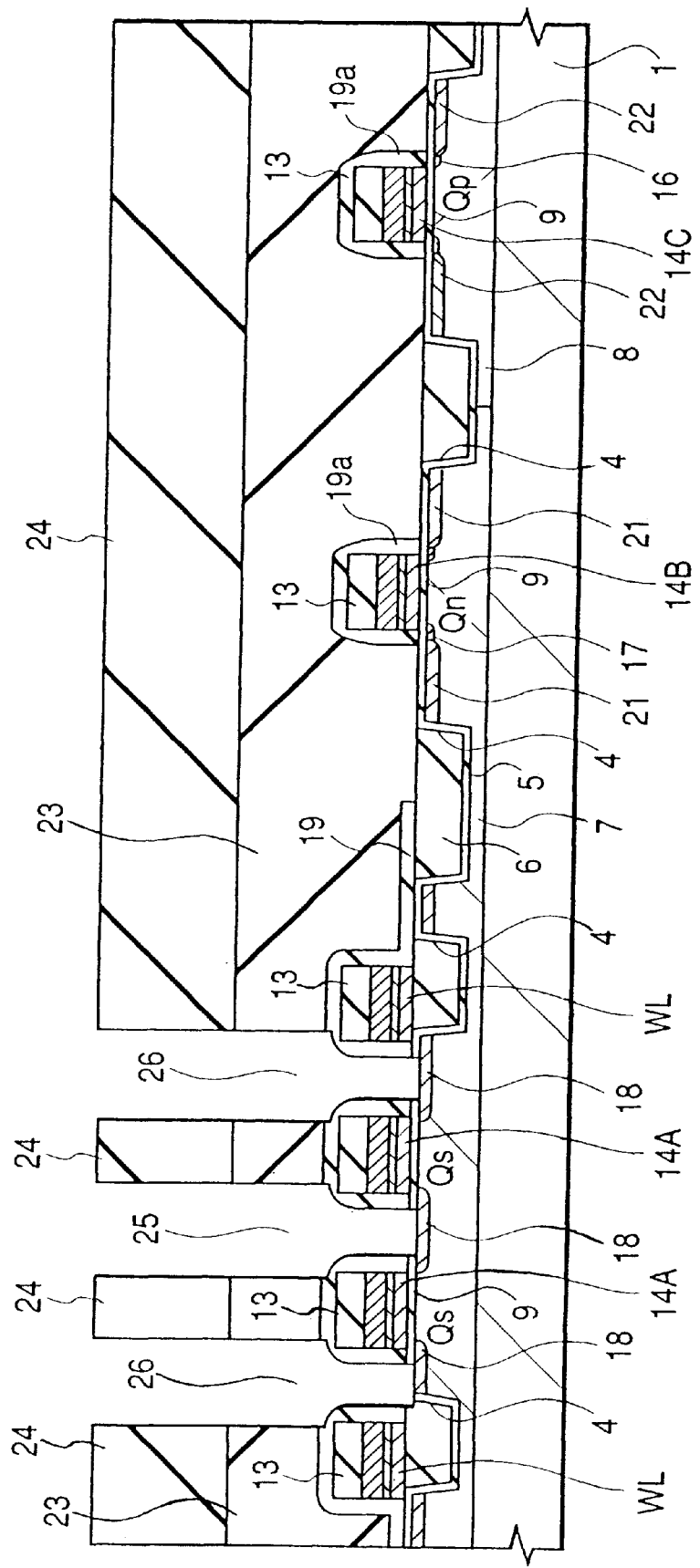
FIG. 19 is a fragmentary cross-sectional view of a semiconductor substrate illustrating a step in the fabrication process of a DRAM according to one embodiment of the present invention.

As illustrated in FIG. 19, the silicon nitride film 19 and the gate oxide film 9 over the n-type semiconductor regions 18 (source, drain) of MISFETQs for memory cell selection are removed by dry etching using the above photoresist film 24 as a mask, whereby a contact hole 25 is formed over one of the source and drain (n-type semiconductor region 18) and a contact hole 26 is formed over the other one of the source and drain (n-type semiconductor region 18). In order to suppress the cut amount of the semiconductor substrate 1, this dry etching is carried out by suppressing the over etching amount to a minimum level and using an etching gas which permits a large selection ratio to the semiconductor substrate 1 (silicon). Furthermore, this etching is carried out under conditions which permit anisotropic etching of the silicon nitride film 19, thereby allowing the silicon nitride film 19 to remain on the side walls of the gate electrode 14A (word line WL). In this manner, contact holes 25 and 26 are formed in self alignment with the gate electrode 14A (word line WL). It is also possible to form side wall spacers in advance on the side walls of the gate electrode 14A (word line WL) by anisotropic etching of the silicon nitride film 19 in order to form the contact holes 25, 26 in self alignment with the gate electrode 14A (word line WL).

Figure 20:
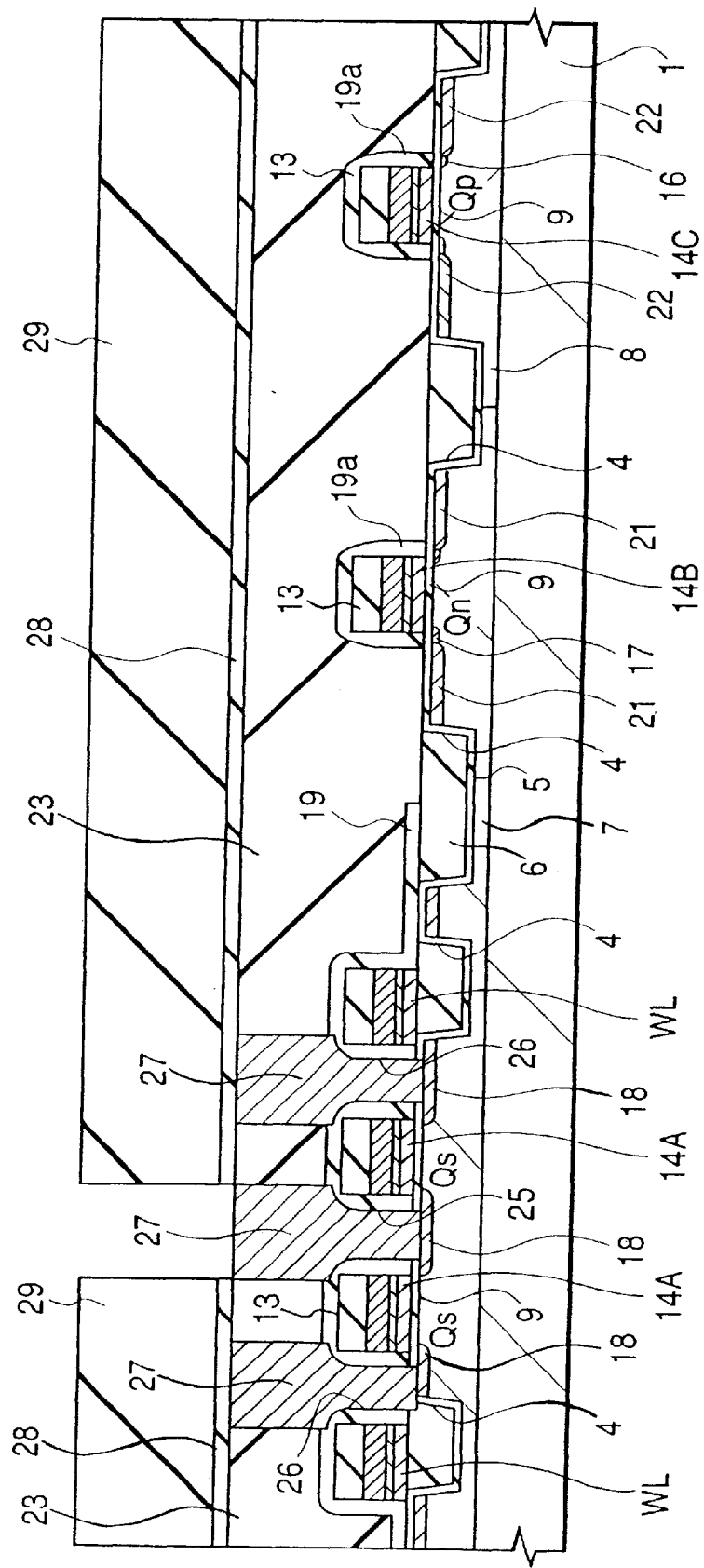
FIG. 20 is a fragmentary cross-sectional view of a semiconductor substrate illustrating a step in the fabrication process of a DRAM according to one embodiment of the present invention.

As illustrated in FIG. 20, plugs 27 are embedded inside of the contact holes 25 and 26, followed by deposition of a silicon oxide film 28 over the silicon oxide film 23 by the CVD method. Then, the silicon oxide film 28 over the contact hole 25 is removed by dry etching with a photoresist film 29 as a mask. The plugs 27 are embedded inside of the contact holes 25 and 26 by depositing, over the silicon oxide film 23, a polycrystalline silicon film having P (phosphorus) doped therein, and then polishing the resulting polycrystalline silicon film by a chemical mechanical polishing method to remove the polycrystalline silicon film over the silicon oxide film 23. A portion of P (phosphorus) in the polycrystalline silicon film diffuses from the bottom of the contact holes 25, 26 to the n-type semiconductor regions 18 (source, drain) in the high-temperature step which will be conducted later, thereby lowering the resistance of the n-type semiconductor regions 18.

Figure 21:
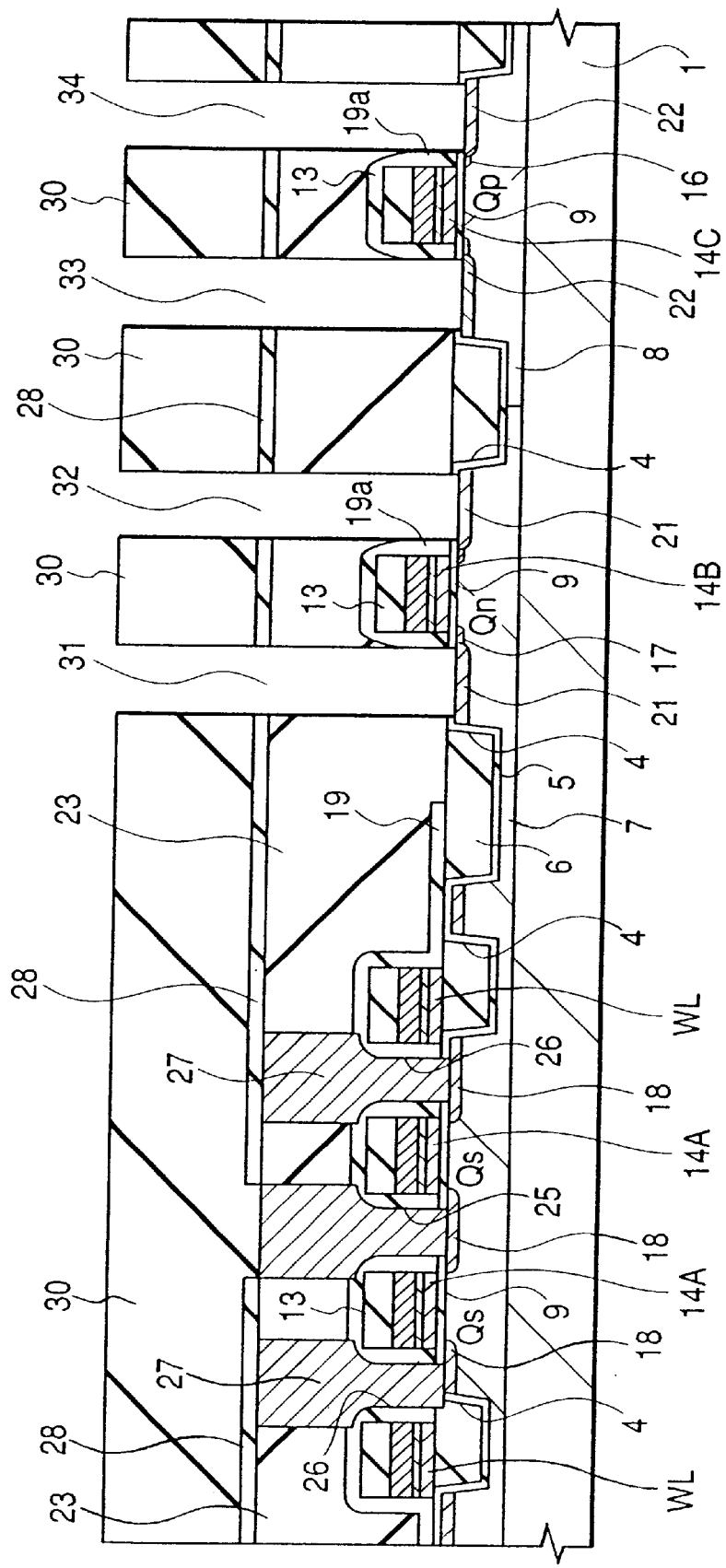
FIG. 21 is a fragmentary cross-sectional view of a semiconductor substrate illustrating a step in the fabrication process of a DRAM according to one embodiment of the present invention.

As illustrated in FIG. 21, the silicon oxide films 28 and 23 and gate oxide film 9 of the peripheral circuit are removed by dry etching using a photoresist 30 as a mask, whereby contact holes 31 and 32 are formed over the source and drain (n+ type semiconductor regions 21) of the n-channel type MISFETQn and contact holes 33 and 34 are formed over the source and drain (P+ type semiconductor regions 22) of the p-channel type MISFETQP. This etching is carried out in such a way that the etching rate of the silicon oxide film becomes larger relative to the silicon nitride film 13 and sidewall spacer 19a. The contact holes 31 and 32 are formed in self alignment with the gate electrode 14B, while the contact holes 33 and 34 are formed in self alignment with the gate electrode 14C.

Figure 22:
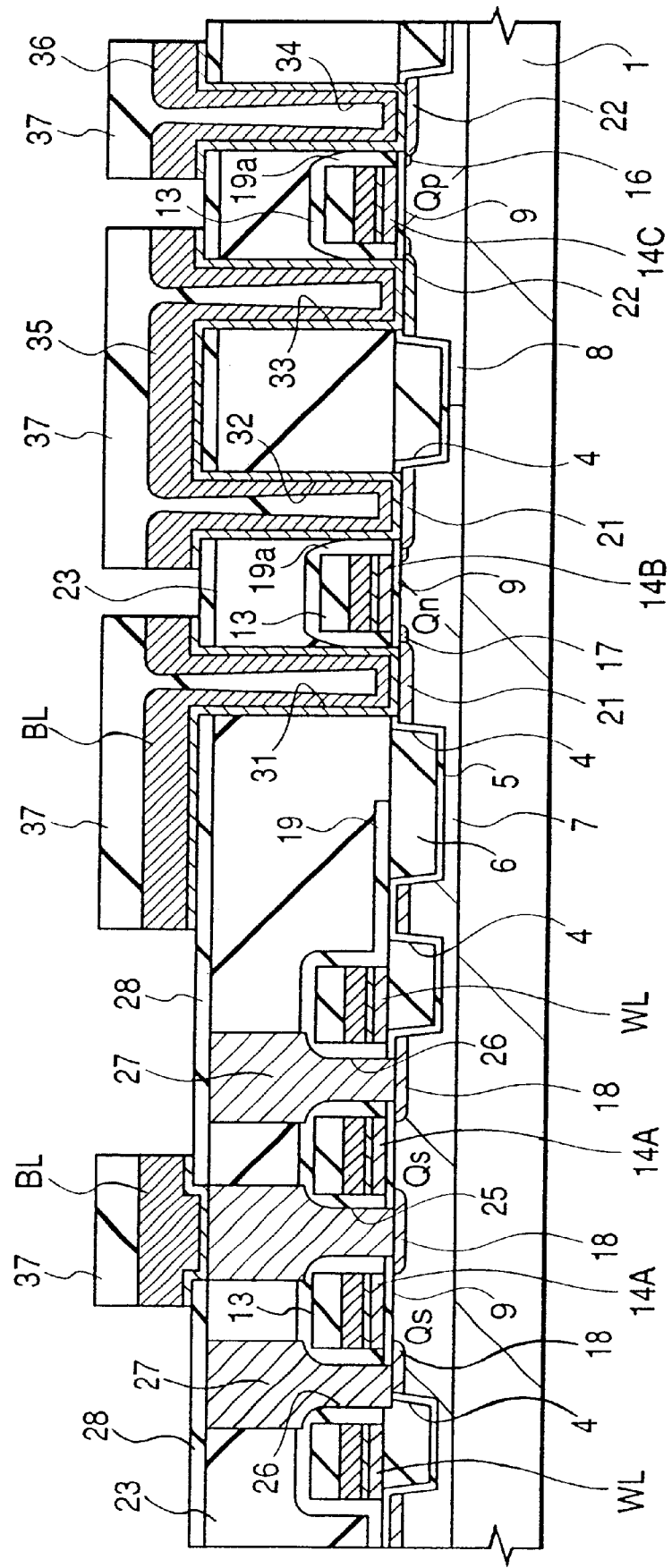
FIG. 22 is a fragmentary cross-sectional view of a semiconductor substrate illustrating a step in the fabrication process of a DRAM according to one embodiment of the present invention.

As illustrated in FIG. 22, a bit line BL and the first film interconnections 35 and 36 of the peripheral circuit are formed over the silicon oxide film 28. The bit line BL and first film interconnections 35 and 36 are formed, for example, by depositing a TiN film and a W film over the silicon oxide film 28 by sputtering, depositing a silicon oxide film 37 over the W film by the CVD method and then patterning these films successively by using a photoresist film as a mask.

Figure 23:
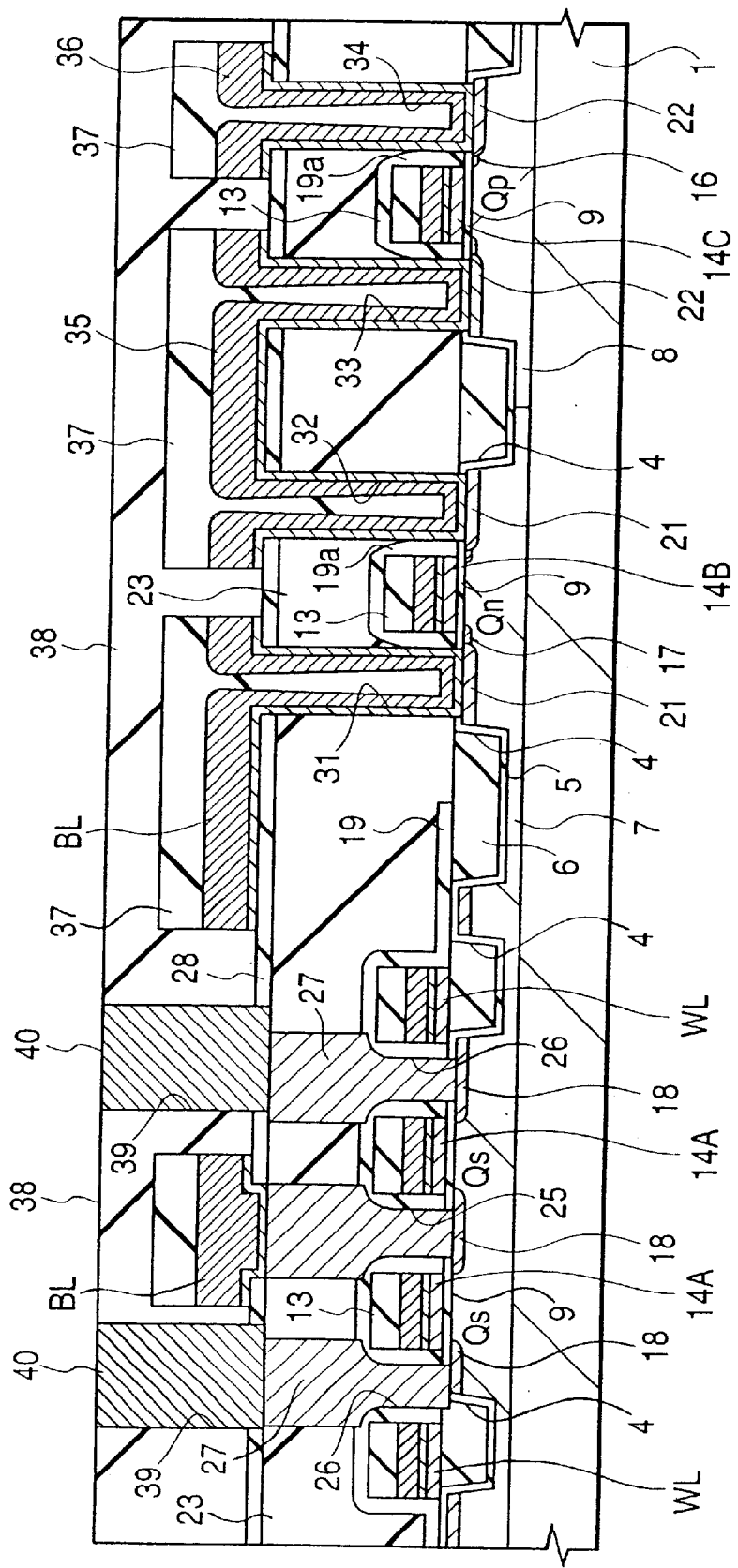
FIG. 23 is a fragmentary cross-sectional view of a semiconductor substrate illustrating a step in the fabrication process of a DRAM according to one embodiment of the present invention.

As illustrated in FIG. 23, a silicon oxide film 38 is deposited over the bit line BL and the first film interconnections 35 and 36 by the CVD method. With a photoresist film as a mask, the silicon oxide films 38 and 28 over the contact hole 26 are removed by dry etching, whereby a through hole 39 is formed. A plug 40 is embedded inside of this though hole 39. The plug 40 is formed, for example, by depositing a W film over the silicon oxide film 38 by sputtering and then polishing the resulting W film by a chemical and mechanical polishing method so as to leave the W film inside of the through hole 39.

Figure 24:
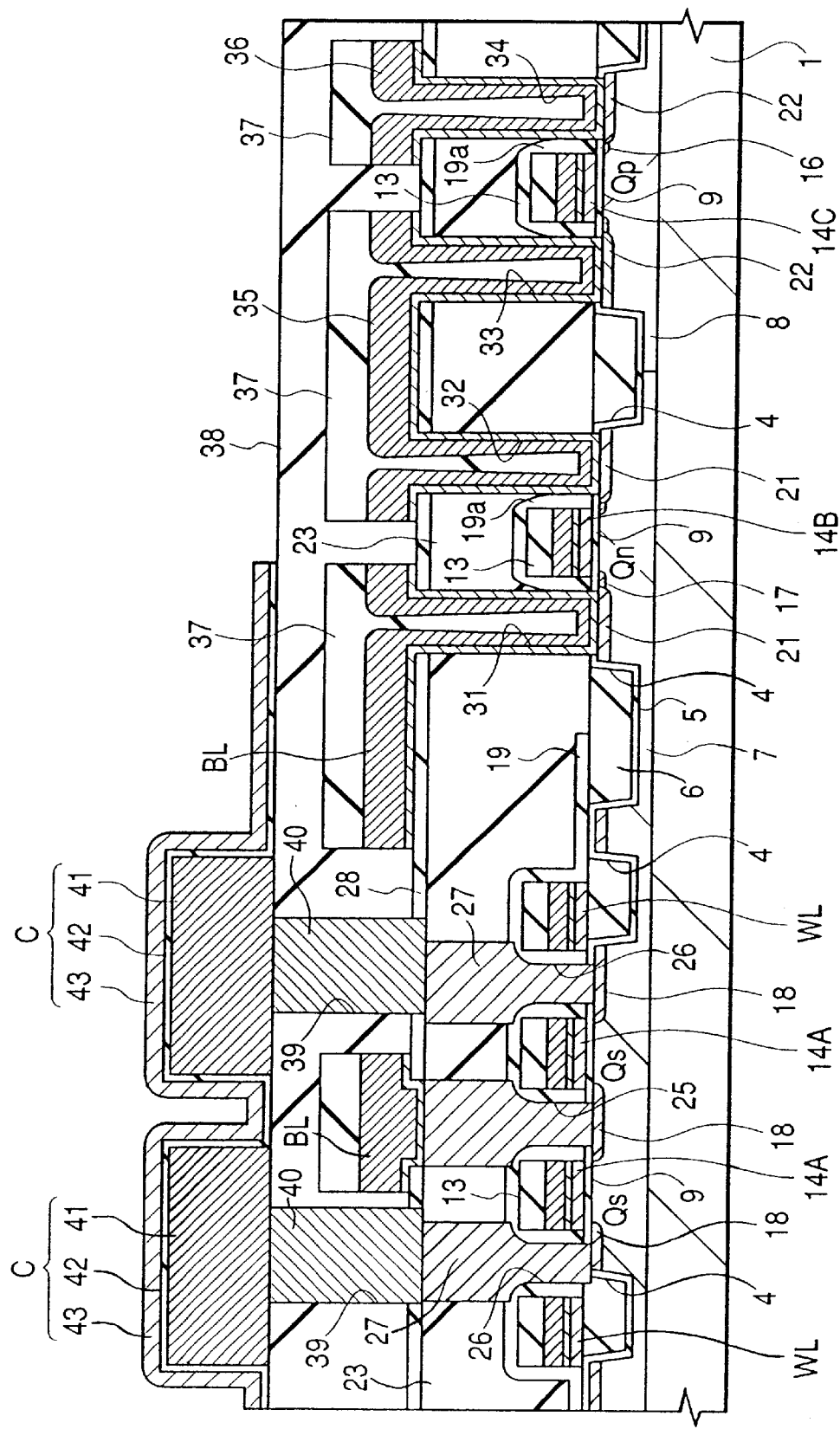
FIG. 24 is a fragmentary cross-sectional view of a semiconductor substrate illustrating a step in the fabrication process of a DRAM according to one embodiment of the present invention.

As illustrated in FIG. 24, a capacitative element C for the information storage, which is made of a lower electrode 41, capacitative insulating film 42 and upper electrode 43 stacked one after another, is formed over the through hole 39, whereby a memory cell of the DRAM having MISFETQs for memory cell selection and the capacitative element C for information storage connected in series therewith is substantially completed. The lower electrode 41 of the capacitative element C for information storage is formed, for example, by depositing aW film over the silicon oxide film 38 by the CVD or sputtering method and then patterning the resulting W film by dry etching with a photoresist film as a mask. The capacitative insulation film 42 and the upper electrode 43 are formed by depositing a tantalum oxide film over the lower electrode 41 by the CVD or sputtering method, depositing thereon a TiN film by sputtering and then patterning these films successively by etching with a photoresist film as a mask. Over the capacitative element C for information storage, an Al interconnection made of two films or so is formed but it is not illustrated.

Figure 25:
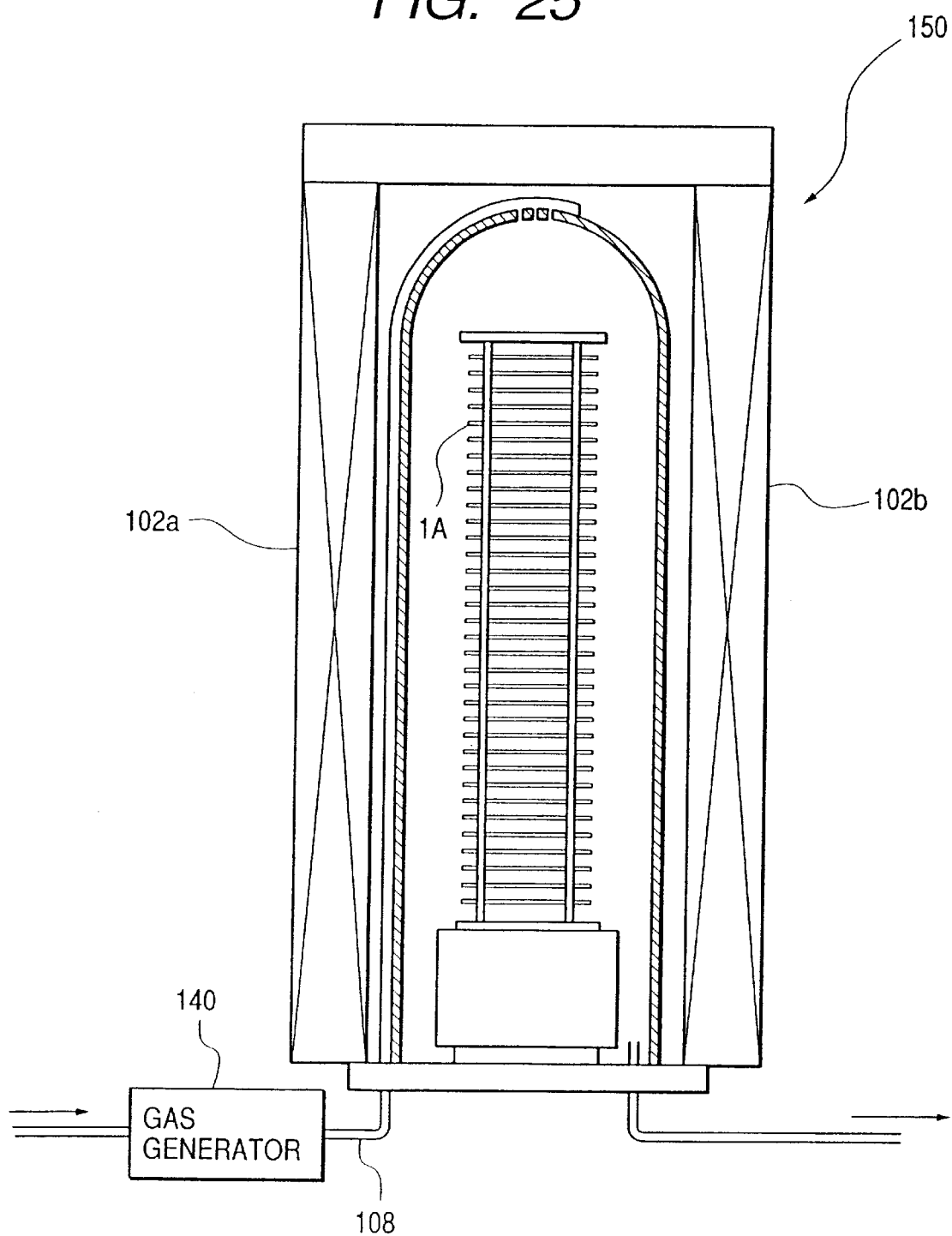
FIG. 25 is a schematic diagram of a batch-type vertical oxidizing furnace to be used for light oxidation treatment.
Figure 26:
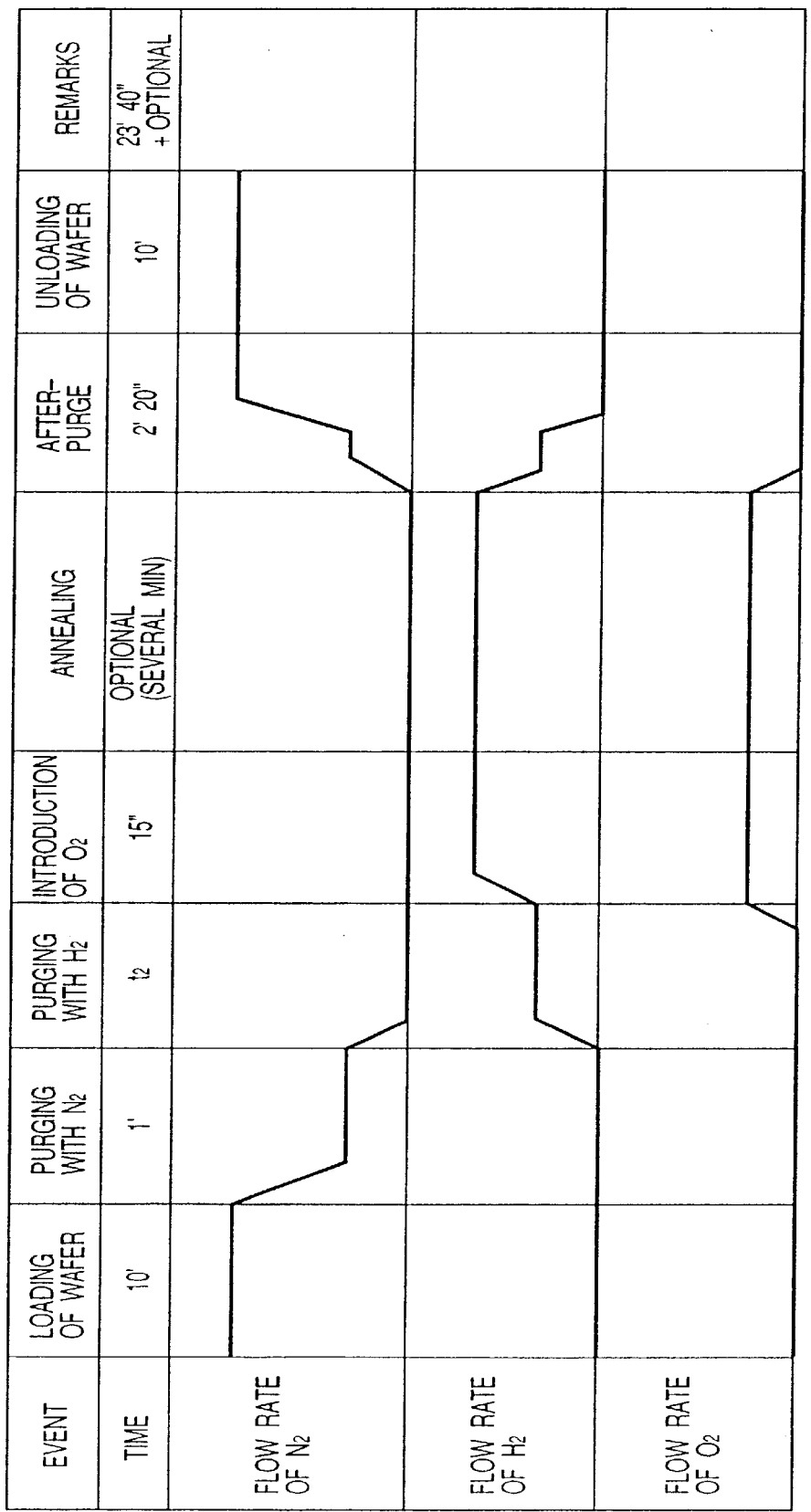
FIG. 26 is a diagram which illustrates a sequence of light oxidizing steps using a batch-type vertical oxidizing furnace.

The light oxidation treatment of the gate oxide film can also be carried out by installing a catalytic system water vapor/hydrogen mixed gas generator 140, as described above, to a batch system vertical oxidizing furnace 150 as illustrated in FIG. 25. FIG. 26 illustrates one example of the sequence of the light oxidation treatment step by using the batch system vertical oxidizing furnace 150.

The invention completed by the present inventors was specifically described above based on various embodiments. It should be borne in mind, however, that the present invention is not limited to these embodiments, but can be modified within a range not departing from the spirit or scope of the present invention as set forth herein.

In the above embodiment, a description was made of the light oxidation treatment of a MOSFET which constitutes a memory cell and a peripheral circuit of a DRAM. The present invention is not limited thereto, but is particularly suited for use in the light oxidation treatment of various devices having a circuit formed of a minute MOSFET which is required to have a gate oxide film of a thickness as thin as 5 nm or less formed uniformly and with good reproducibility.

What is claimed is:

1. A process for the fabrication of a semiconductor integrated circuit device, comprising the steps of:
    (a) forming a silicon film over a silicon-oxide-film-containing gate insulation film which has been formed over a silicon surface of a wafer;
    (b) forming a refractory metal film of tungsten or molybdenum over said silicon film through a medium of a barrier layer of a nitride of tungsten;
    (c) forming a gate electrode by patterning said silicon film and said refractory metal film; and
    (d) after said step (c), thermally oxidizing the silicon film without oxidizing said refractory metal film, under a gas ambient containing (1) hydrogen, and (2) water vapor synthesized from a mixed gas of oxygen and hydrogen gases by a catalyst, and containing substantially no hydrogen radicals, the partial pressure of the water vapor being lower than that of the hydrogen in the gas ambient.

2. A process according to claim 1, wherein said gas ambient does not contain nitrogen gas.

3. A process according to claim 1, wherein in the step (d), said wafer is heated to a temperature in a range of 800 to 900° C.

4. A process for the fabrication of a semiconductor integrated circuit device, comprising the steps of:
    (a) forming a silicon film over a silicon-oxide-film-containing gate insulation film, the gate insulation film having a thickness of not more than 5 nm and being formed over a silicon surface of a major surface of a wafer;
    (b) forming a refractory metal film over said silicon film;
    (c) forming a gate electrode by patterning said silicon film and said refractory metal film, a gate length of the gate electrode being not more than 0.25 µm; and
    (d) after said step (c), thermally oxidizing the silicon film without oxidizing said refractory metal film, under a hydrogen gas ambient containing water vapor synthesized from a mixed gas of oxygen and hydrogen gases by a catalyst, the partial pressure of the water vapor being lower than that of the hydrogen in the hydrogen gas ambient, the upper limit of total oxide film thickness grown by said thermally oxidizing being about one and a half of the thickness of the gate insulation film.

5. A process according to claim 4, wherein said hydrogen gas ambient does not contain nitrogen.

6. A process according to claim 4, wherein in step (d), said wafer is heated to a temperature in a range of 800 to 900° C.

7. A process for the fabrication of a semiconductor integrated circuit device, comprising the steps of:
    (a) forming a first film of silicon over a silicon-oxide-film-containing gate insulation film which has been formed over a silicon surface of a major surface of a wafer;
    (b) forming a refractory metal film of tungsten or molybdenum over said first film;
    (c) forming a gate electrode by patterning said first film and said refractory metal film; and
    (d) after said step (c), thermally oxidizing the first film without oxidizing said refractory metal film, under a hydrogen gas ambient, substantially without nitrogen gas, the hydrogen gas ambient containing water vapor synthesized from a mixed gas of oxygen and hydrogen gases by a catalyst, the partial pressure of the water vapor being lower than that of hydrogen gas in the hydrogen gas ambient.

8. A process for the fabrication of a semiconductor integrated circuit device, comprising the steps of:
    (a) forming an isolation groove in a silicon surface of a major surface of a wafer;
    (b) embedding an insulating material in said groove;
    (c) after the step (b), planarizing the major surface of said wafer by chemical mechanical polishing;
    (d) forming a silicon film over a gate insulation film containing a silicon oxide film having a thickness not more than 5 nm, said silicon oxide film being a principal portion of the entire thickness of the gate insulation film, the silicon oxide film having been formed over the silicon surface of said wafer by thermally oxidizing the silicon surface;
    (e) forming a refractory metal film over said silicon film;
    (f) forming a gate electrode by patterning said silicon film and said refractory metal film, the gate length of said gate electrode being not more than 0.25 µm; and (g) after said step (f), thermally oxidizing the silicon film without oxidizing said refractory metal film, under a hydrogen gas ambient containing water vapor, the partial pressure of the water vapor being lower than that of the hydrogen in the hydrogen gas ambient.

9. A process according to claim 8, wherein said hydrogen gas ambient does not contain nitrogen gas.

10. A process according to claim 8, wherein in step (g), said wafer is heated to a temperature in a range of 800 to 900° C.

11. A process for the fabrication of a semiconductor integrated circuit device, comprising the steps of:
 (a) forming a silicon film over a silicon-oxide-film-containing gate insulation film, the gate insulation film having a thickness not more than 5 nm and formed over a silicon surface of a major surface of a wafer;
 (b) forming a refractory metal film of tungsten over said silicon film;
 (c) forming a gate electrode by patterning said silicon film and said refractory metal film, the gate length of said gate electrode being not more than 0.25 $\mu$m; and
 (d) after said step (c), thermally oxidizing the silicon film without oxidizing said refractory metal film, under a gas ambient containing hydrogen and water vapor, and containing substantially no hydrogen radicals, the partial pressure of the water vapor being lower than that of the hydrogen in the gas ambient.

12. A process for the fabrication of a semiconductor integrated circuit device, the semiconductor integrated circuit device comprising:
 (a) a gate insulating film over a silicon-base surface region;
 (b) a gate electrode having:
  (i) a lower polysilicon film constituting a silicon-base region together with the silicon-base surface region, said silicon-base region including silicon as its principal component; and
  (ii) an upper refractory metal film including a refractory metal as its principal component,
 wherein the upper refractory metal film constitutes a refractory metal region including a refractory metal as one of its principal components, and the gate insulating film and the gate electrode are elements of an insulated gate field effect transistor over a major surface of a substrate region,
 the fabrication process comprising:
  (x) after patterning the gate electrode, performing heat treatment, in a heat treatment chamber of a single wafer processing furnace by lamp heating under a mixed gas ambient including hydrogen gas and water vapor synthesized from hydrogen gas and oxygen gas by catalyst, of a wafer including the substrate region so as to oxidize the silicon-base region without oxidizing the refractory metal region.

13. A process according to claim 12, wherein said water vapor synthesized from hydrogen gas and oxygen gas is transferred into the heat treatment chamber while maintaining its gas state.

14. A process according to claim 13, wherein said synthesis of water vapor is performed at a temperature lower than that of the heat treatment of the wafer.

15. A process according to claim 14, wherein a gate length of the insulated gate field effect transistor is not longer than 0.25 $\mu$m.

16. A process according to claim 15, wherein a thickness of the gate insulating film is not thicker than 5 nm.

17. A process according to claim 16, wherein the composition of hydrogen and oxygen in a gas provided to synthesize the r vapor is hydrogen-rich.

18. A process according to claim 17, wherein the heat treatment is performed at a temperature not lower than 800 degrees centigrade.

19. A process for the fabrication of a semiconductor integrated circuit device, comprising:
 (a) forming a first insulating film over a surface region, said surface region including silicon as its principal component, over a major surface of a wafer, wherein said first insulating film is to be a gate insulating film of an insulated gate field effect transistor;
 (b) forming a first silicon-containing film over the first insulating film, wherein said first silicon-containing film includes silicon as its principal component;
 (c) forming a first refractory metal film over the first silicon containing film, wherein said first refractory metal film includes refractory metal as its principal component;
 (d) forming a gate electrode of the insulated gate field effect transistor by patterning the first silicon-containing film and the first refractory metal film;
 (e) after step (d), performing heat treatment, in a heat treatment chamber of a single wafer processing furnace by lamp heating under a mixed gas ambient including hydrogen gas and water vapor synthesized from hydrogen gas and oxygen gas by catalyst, of the wafer so as to oxidize the surface region and the first silicon-containing film without oxidizing the first refractory metal film.

20. A process according to claim 19, wherein said water vapor synthesized from hydrogen gas and oxygen gas is transferred into the heat treatment chamber while maintaining its gas state.

21. A process according to claim 20, wherein the synthesis of water vapor is performed at a temperature lower than that of the heat treatment of the wafer.

22. A process according to claim 21, wherein a gate length of the gate electrode of the insulated gate field effect transistor is not longer than 0.25 $\mu$m.

23. A process according to claim 22, wherein a thickness of the gate insulating film is not thicker than 5 nm.

24. A process according to claim 23, wherein the composition of hydrogen and oxygen in a gas provided to synthesize the water vapor is hydrogen-rich.

25. A process according to claim 24, wherein the heat treatment of the wafer is performed at a temperature not lower than 800 degrees centigrade.

26. A process for the fabrication of a semiconductor integrated circuit device, comprising:
 (a) forming a first insulating film over a silicon surface region over a major surface of a wafer, wherein said first insulating film is to be a gate insulating film of an insulated gate field effect transistor;
 (b) forming a first silicon-containing film over the first insulating film, wherein said first silicon-containing film includes silicon as its principal component;
 (c) forming a first refractory metal film over the first silicon-containing film;
 (d) forming a gate electrode of the insulated gate field effect transistor by patterning the first silicon-containing film and the first refractory metal film;
 (e) after step (d), performing heat treatment, in a heat treatment chamber of a single wafer processing furnace by lamp heating under a mixed gas ambient including hydrogen gas and water vapor synthesized from hydrogen gas and oxygen gas by catalyst, of the wafer so as to oxidize the surface region and the first silicon-containing film without oxidizing the first refractory metal film.

27. A process according to claim 26, wherein said water vapor synthesized from hydrogen gas and oxygen gas is transferred into the heat treatment chamber while maintaining its gas state.

28. A process according to claim 27, wherein the synthesis of water vapor is performed at a temperature lower than that of the heat treatment of the wafer.

29. A process according to claim 28, wherein a gate length of the gate electrode of the insulated gate field effect transistor is not longer than 0.25 $\mu$m.

30. A process according to claim 29, wherein a thickness of the gate insulating film is not thicker than 5 nm.

31. A process according to claim 30, wherein the composition of hydrogen and oxygen in a gas provided to synthesize the water vapor is hydrogen-rich.

32. A process according to claim 31, wherein the heat treatment of the wafer is performed at a temperature not lower than 800 degrees centigrade.

33. A process for fabrication of a semiconductor intergrated circuit device, comprising the steps of:
   (a) forming a silicon film over a silicon-oxide-film-containing gate insulation film, the gate insulation film having a thickness of not more than 5 nm and formed over a silicon surface of a major surface of a wafer;
   (b) forming a refractory metal film overlying said silicon film;
   (c) forming a gate electrode by patterning said silicon film and said refractory metal film, the gate length of said gate electrode being not more than 0.25 $\mu$m; and
   (d) after said step (c), thermally oxidizing the silicon film without oxidizing said refractory metal film, under a gas ambient containing hydrogen and water vapor, and containing substantially no hydrogen radicals, the partial pressure of the water vapor being lower than that of the hydrogen in the gas ambient.

34. A process for the fabrication of a semiconductor integrated circuit device, comprising the steps of:
   (a) forming a silicon film over a silicon-oxide-film-containing gate insulation film, the gate insulation film having a thickness of not more than 5 nm and formed over a silicon surface of a major surface of a wafer;
   (b) forming a first film, including depositing a nitride of a refractory metal, overlying the silicon film;
   (c) forming a refractory metal film overlying said first film;
   (d) forming a gate electrode by patterning said silicon film, said first film and said refractory metal film, the gate length of said gate electrode being not more than 0.25 $\mu$m; and
   (e) after said step (d), thermally oxidizing the silicon film without oxidizing said refractory metal film, under a gas ambient containing hydrogen and water vapor, and containing substantially no hydrogen radicals, the partial pressure of the water vapor being lower than that of the hydrogen in the gas ambient.

* * * * *